(12) United States Patent
Kim et al.

(10) Patent No.: US 12,453,215 B2
(45) Date of Patent: Oct. 21, 2025

(54) DISPLAY DEVICE HAVING SEMICONDUCTOR LIGHT EMITTING DIODES SEATED IN A PLURALITY OF CELLS, AND METHOD FOR MANUFACTURING THE DISPLAY DEVICE

(71) Applicant: LG ELECTRONICS INC., Seoul (KR)

(72) Inventors: Kisu Kim, Seoul (KR); Changseo Park, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 590 days.

(21) Appl. No.: 17/780,151

(22) PCT Filed: Dec. 18, 2019

(86) PCT No.: PCT/KR2019/017957
§ 371 (c)(1),
(2) Date: May 26, 2022

(87) PCT Pub. No.: WO2021/117957
PCT Pub. Date: Jun. 17, 2021

(65) Prior Publication Data
US 2022/0416126 A1     Dec. 29, 2022

(30) Foreign Application Priority Data
Dec. 11, 2019  (KR) .................. 10-2019-0164884

(51) Int. Cl.
*H10H 20/831* (2025.01)
*H01L 25/075* (2006.01)
(Continued)

(52) U.S. Cl.
CPC ..... *H10H 20/8312* (2025.01); *H01L 25/0753* (2013.01); *H10H 20/01* (2025.01);
(Continued)

(58) Field of Classification Search
CPC . H01L 33/382; H01L 33/387; H01L 25/0753; H01L 25/167; H01L 2933/0016;
(Continued)

(56) References Cited

U.S. PATENT DOCUMENTS

| | | |
|---|---|---|
| 6,536,106 B1 | 3/2003 | Jackson et al. |
| 6,780,696 B1 | 8/2004 | Schatz |

(Continued)

FOREIGN PATENT DOCUMENTS

| | | |
|---|---|---|
| KR | 10-2013-0033450 A | 4/2013 |
| KR | 10-2019-0106885 A | 9/2019 |

*Primary Examiner* — Khiem D Nguyen
(74) *Attorney, Agent, or Firm* — Birch, Stewart, Kolasch & Birch, LLP

(57) ABSTRACT

Discussed is a display device including a base portion; a first electrode formed on the base portion; a dielectric layer stacked on one surface of the first electrode; a second electrode disposed on the dielectric layer at a predetermined interval; a barrier rib portion stacked on the dielectric layer to cover the second electrode while forming a plurality of cells; and semiconductor light emitting diodes seated in the plurality of cells, wherein the first electrode is spaced apart from the second electrode with the dielectric layer disposed therebetween.

4 Claims, 21 Drawing Sheets

(51) Int. Cl.
*H10H 20/01* (2025.01)
*H10H 20/857* (2025.01)

(52) U.S. Cl.
CPC ......... *H10H 20/857* (2025.01); *H10H 20/032* (2025.01); *H10H 20/0364* (2025.01)

(58) Field of Classification Search
CPC ....... H01L 21/76895; H01L 2224/0344; H01L 29/142; H10H 20/8312; H10H 20/857; H10H 20/032; H10H 20/0364
See application file for complete search history.

(56) References Cited

U.S. PATENT DOCUMENTS

| | | | |
|---|---|---|---|
| 9,329,433 B2* | 5/2016 | Negishi | H01L 24/95 |
| 2005/0009303 A1 | 1/2005 | Schatz | |
| 2014/0261613 A1 | 9/2014 | Nielson et al. | |
| 2017/0104009 A1* | 4/2017 | Peng | H01L 29/458 |
| 2017/0133564 A1 | 5/2017 | Ulmer et al. | |
| 2017/0338372 A1* | 11/2017 | Teraguchi | H01L 33/06 |
| 2018/0019369 A1* | 1/2018 | Cho | H05K 1/181 |
| 2019/0326349 A1* | 10/2019 | Kwon | H10H 20/856 |
| 2019/0326477 A1* | 10/2019 | Kim | H01L 33/20 |
| 2020/0235076 A1* | 7/2020 | Batres | H01L 21/6835 |
| 2022/0352446 A1* | 11/2022 | Chung | H10H 20/8312 |
| 2022/0362446 A1 | 11/2022 | Chung et al. | |

* cited by examiner

[FIG. 1]
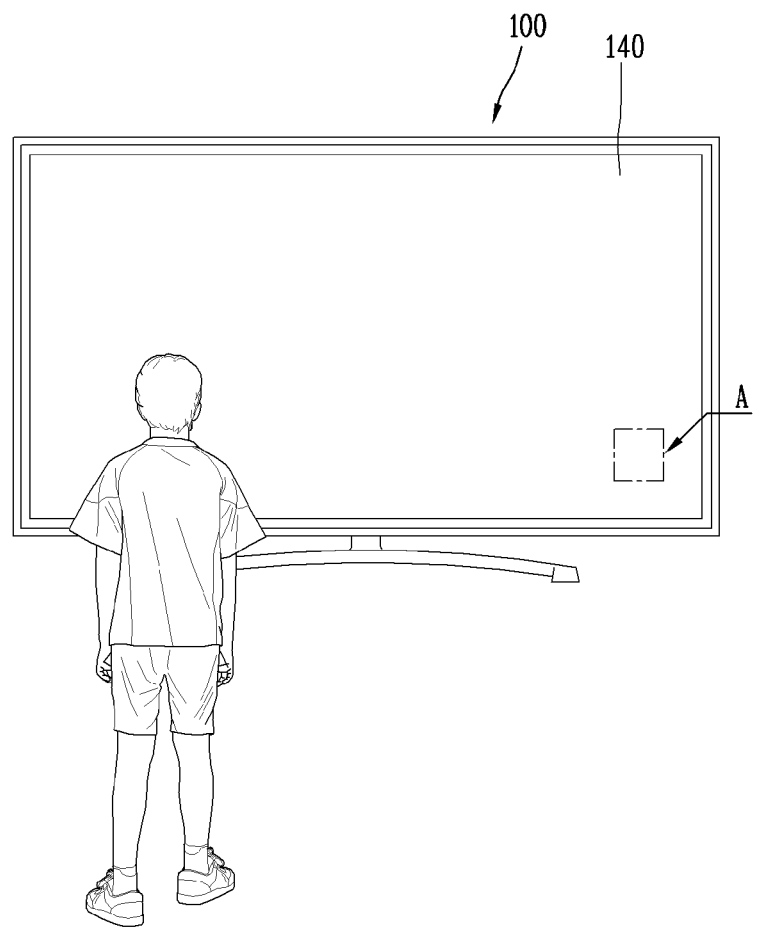

【FIG. 2】
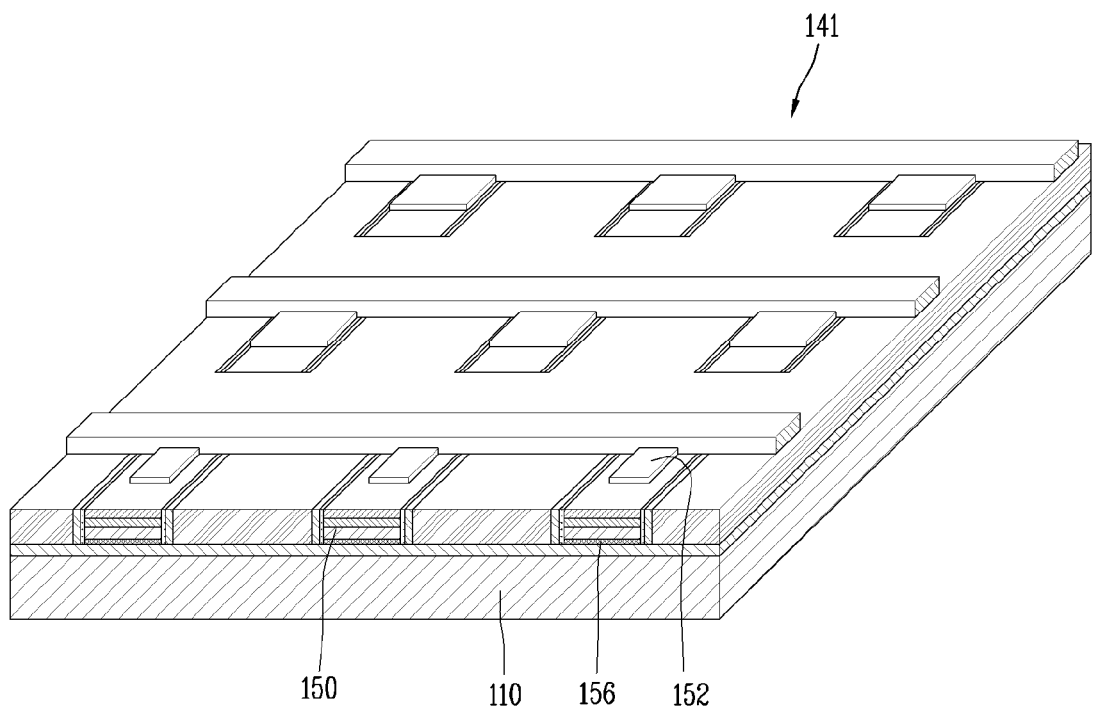

【FIG. 3】
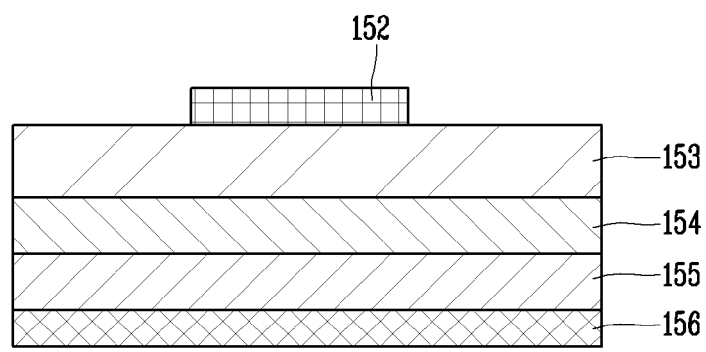
【FIG. 4】
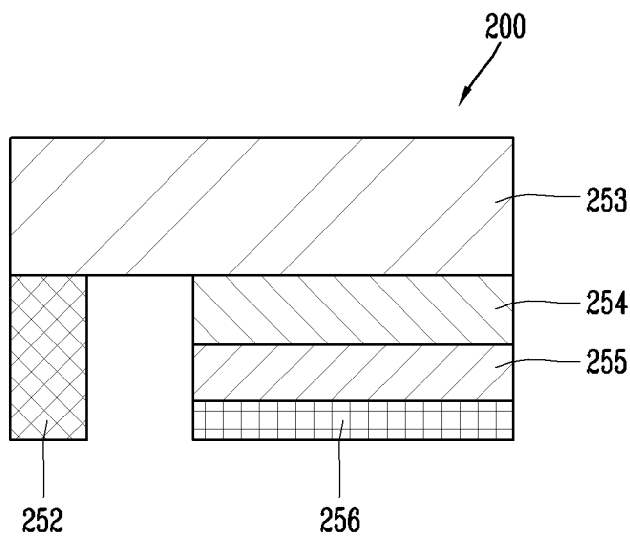

【FIG. 5a】
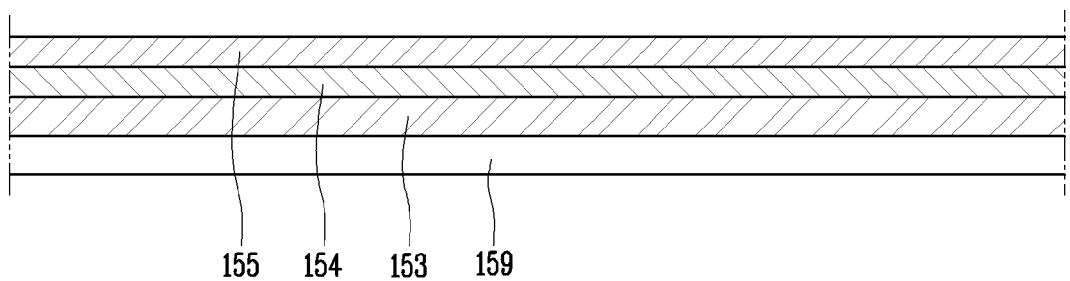
【FIG. 5b】
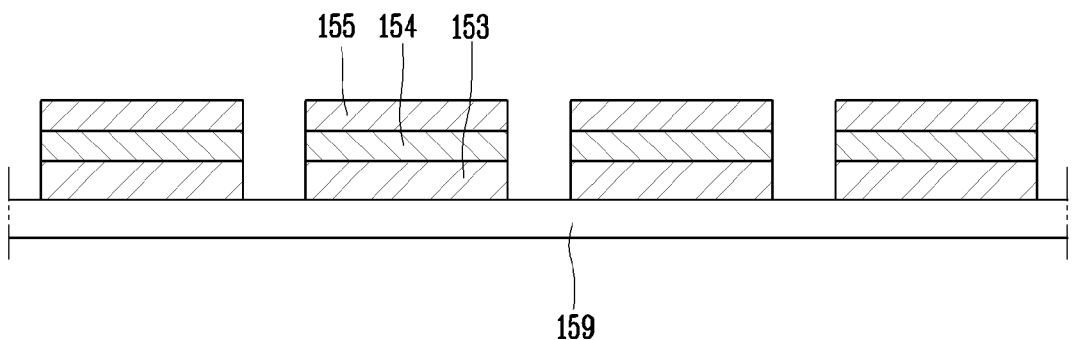
【FIG. 5c】
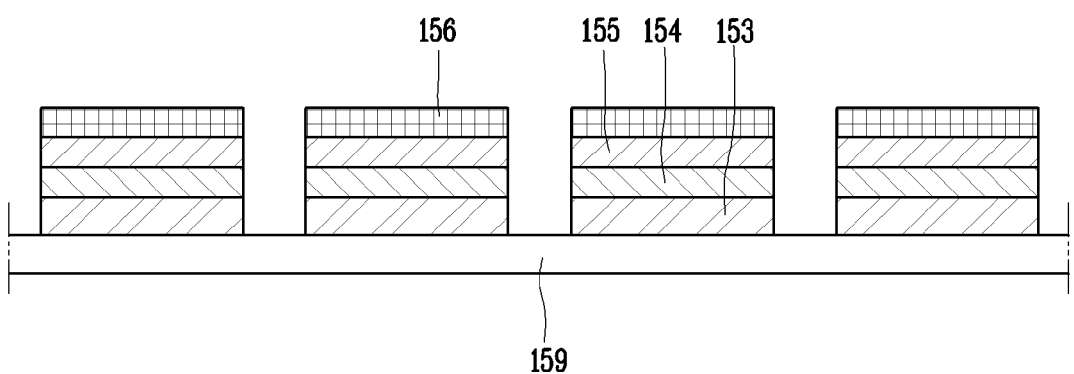

【FIG. 5d】
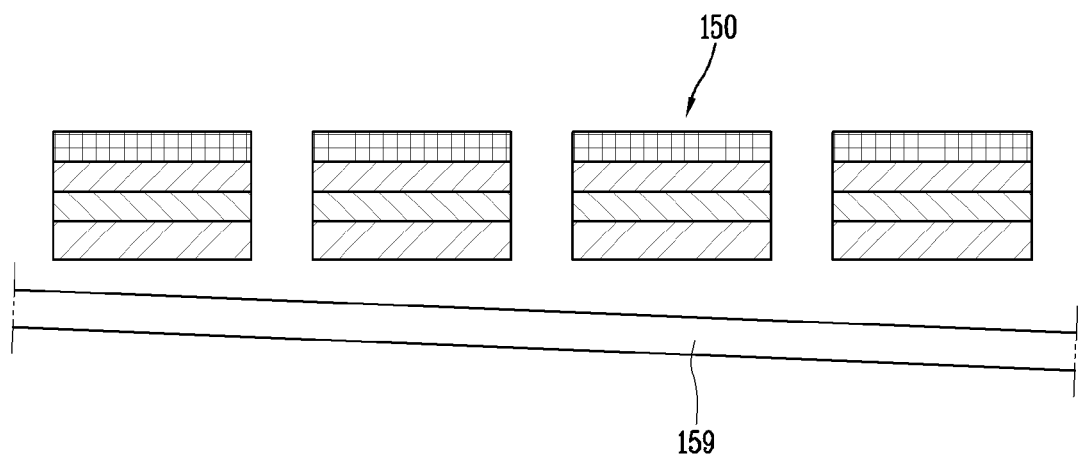
【FIG. 5e】
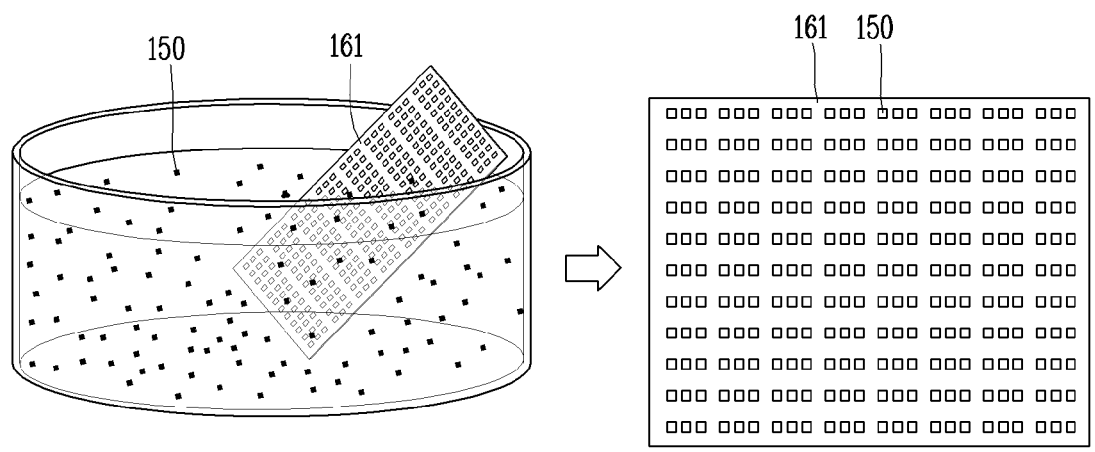

[FIG. 6]
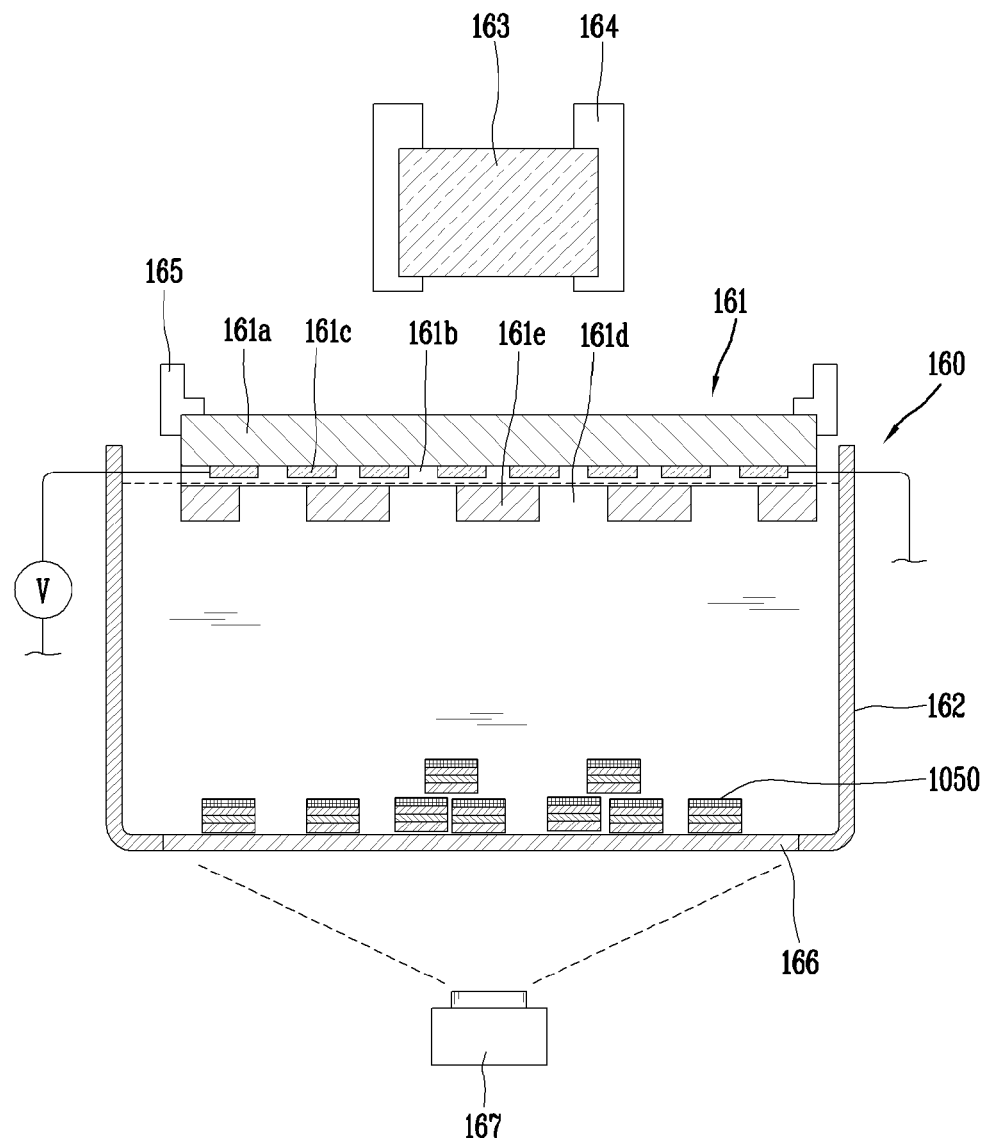

[FIG. 7]
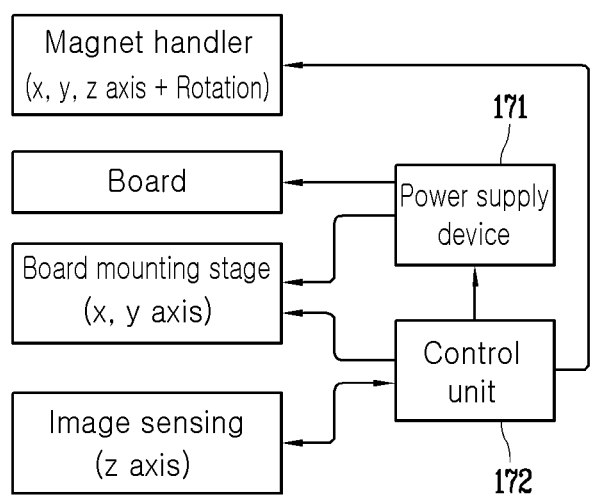

【FIG. 8a】
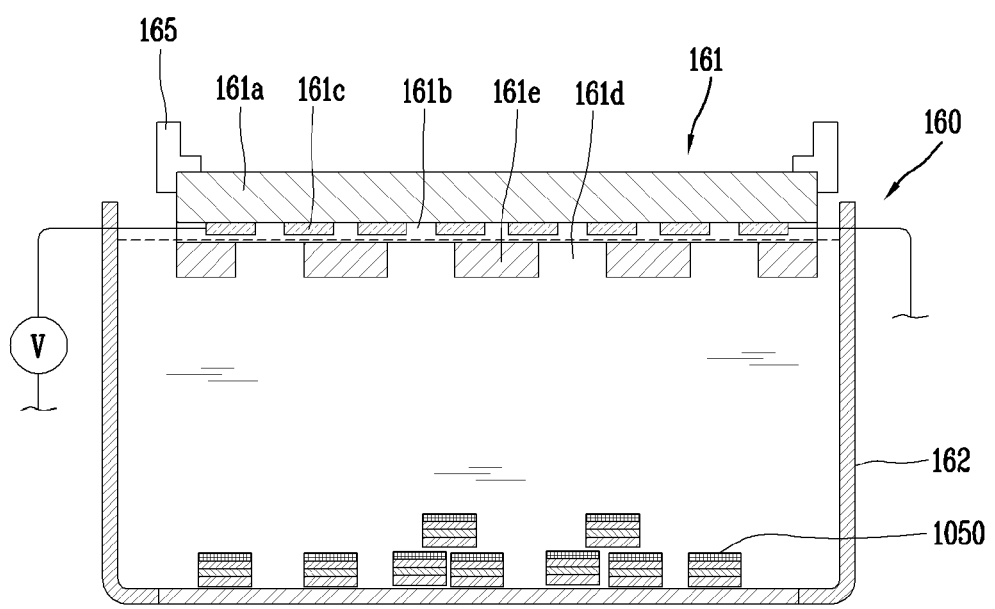

【FIG. 8b】
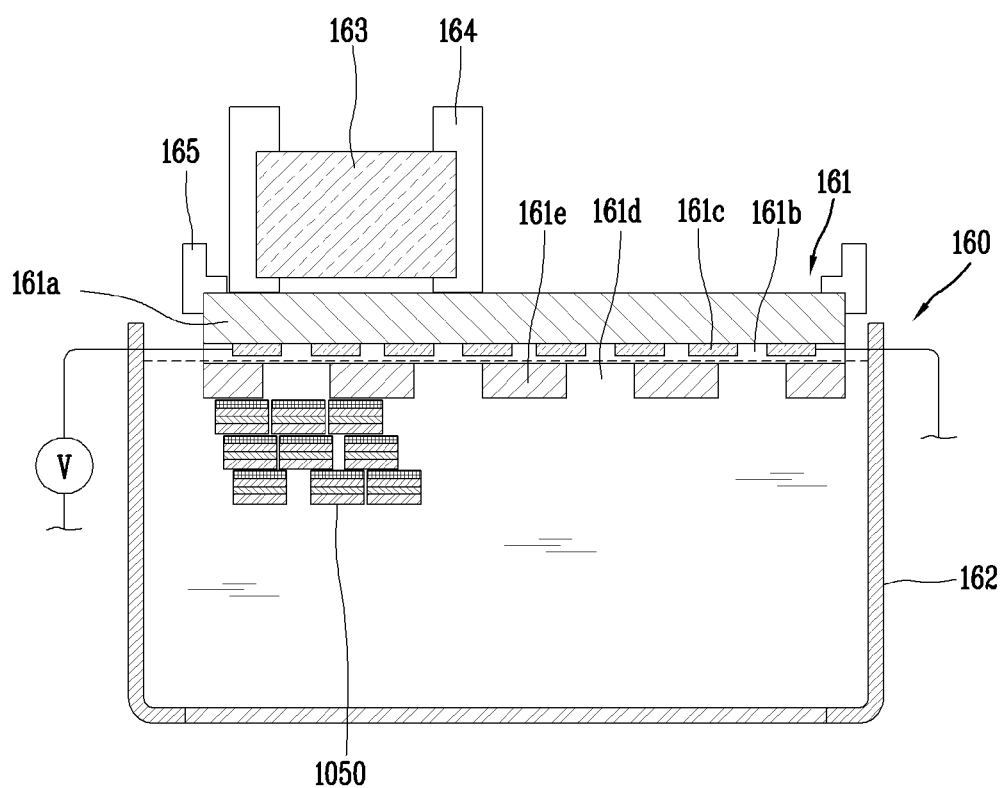

[FIG. 8c]
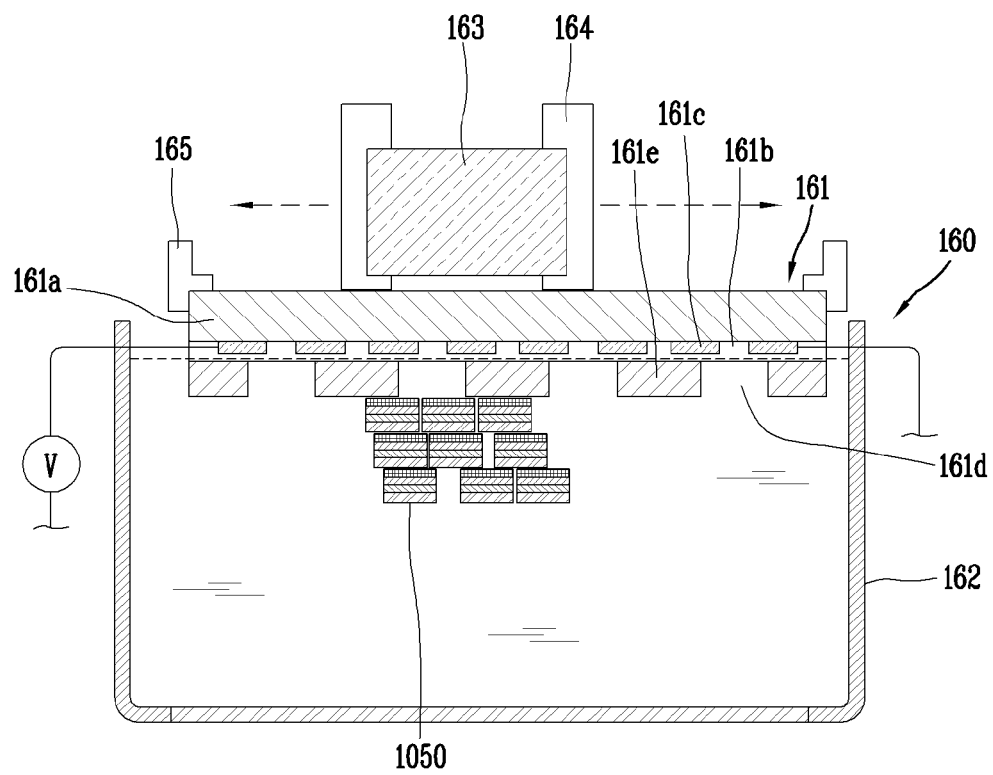

【FIG. 8d】
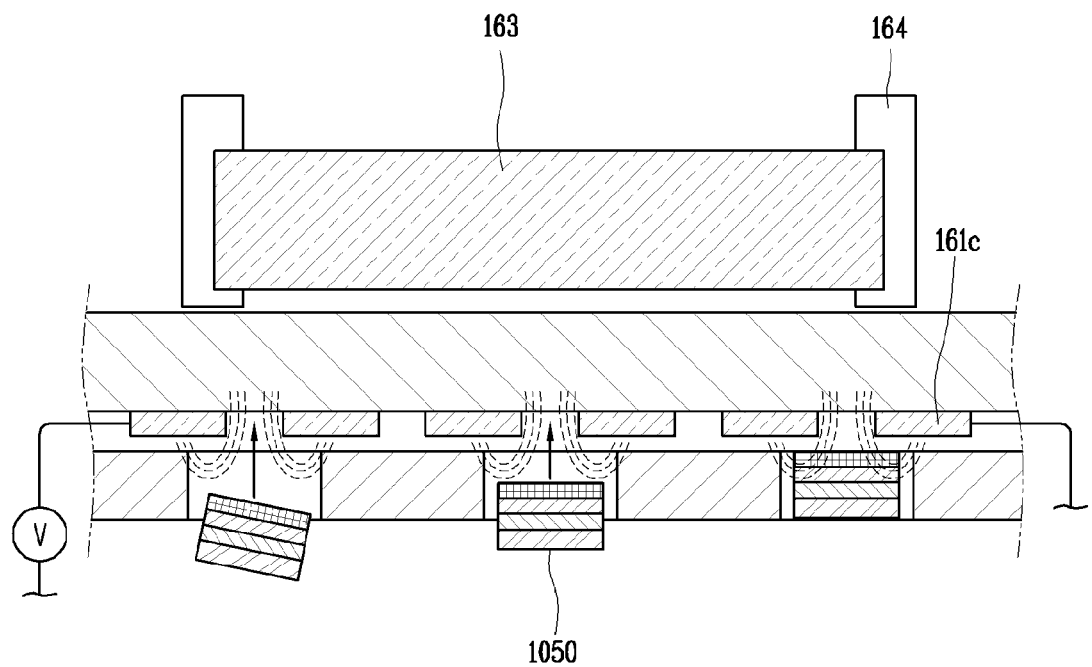
【FIG. 8e】
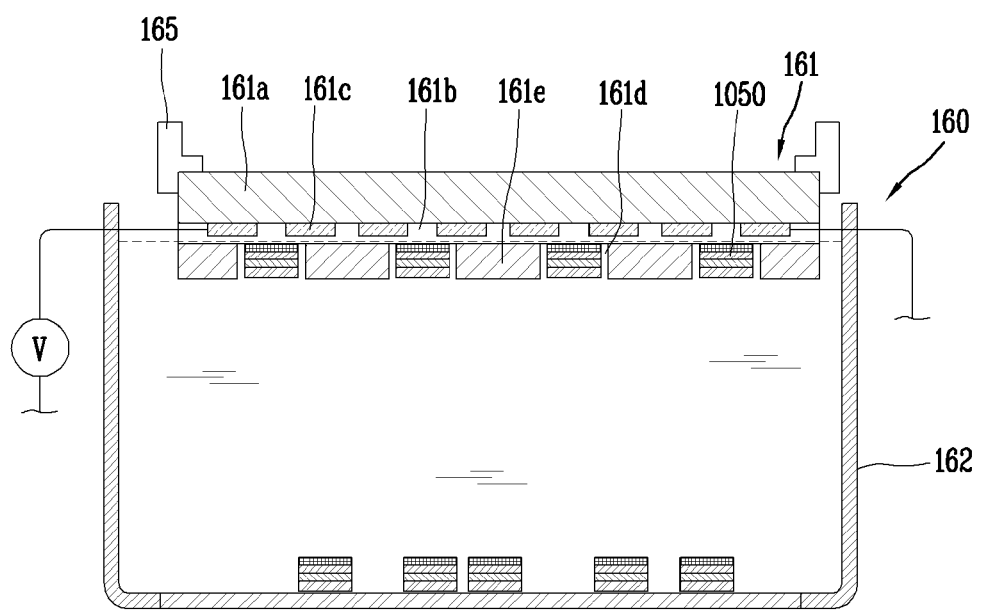

[FIG. 9]
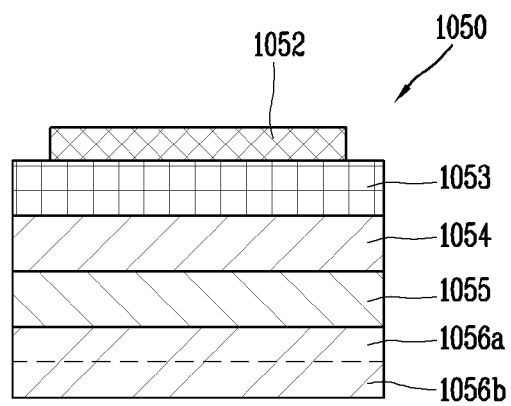

【FIG. 10a】
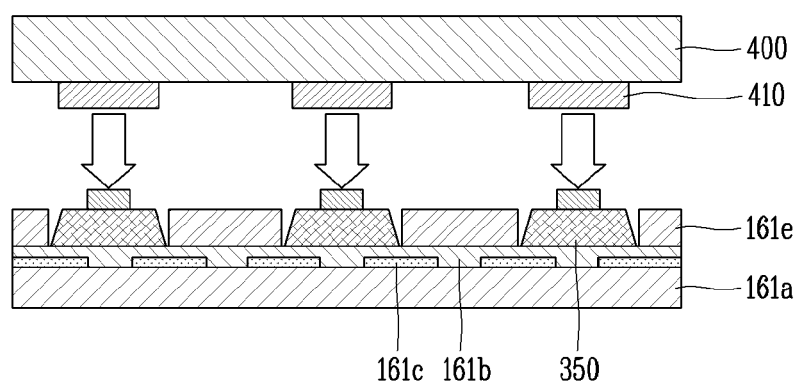
【FIG. 10b】
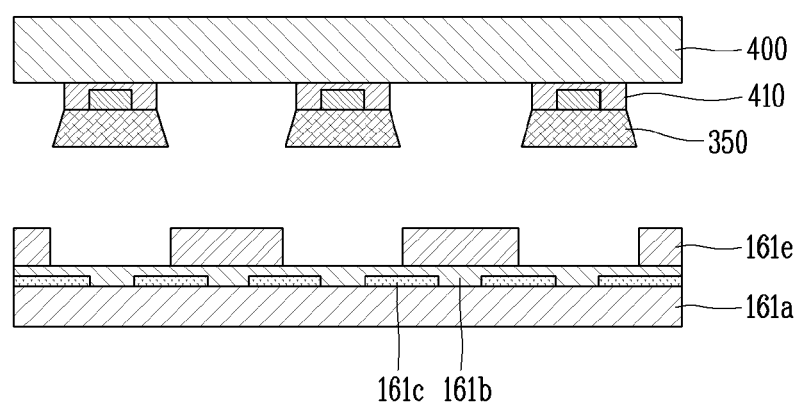

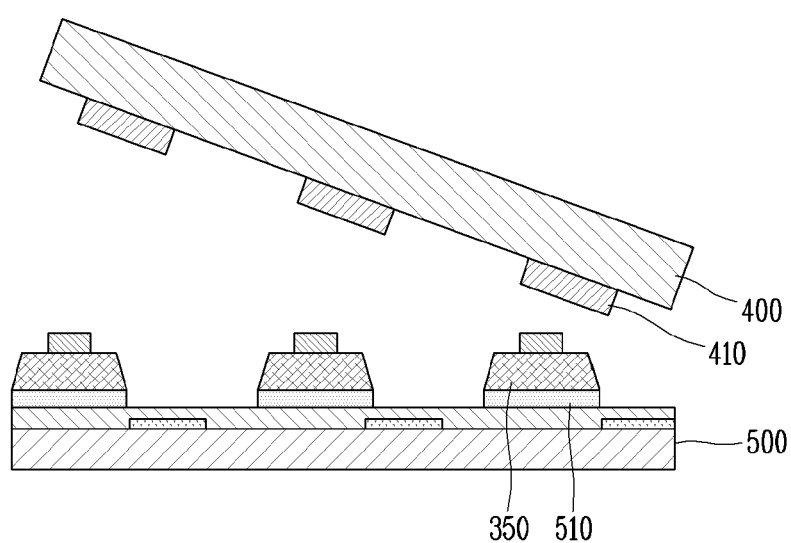
[FIG. 10c]

[FIG. 11]
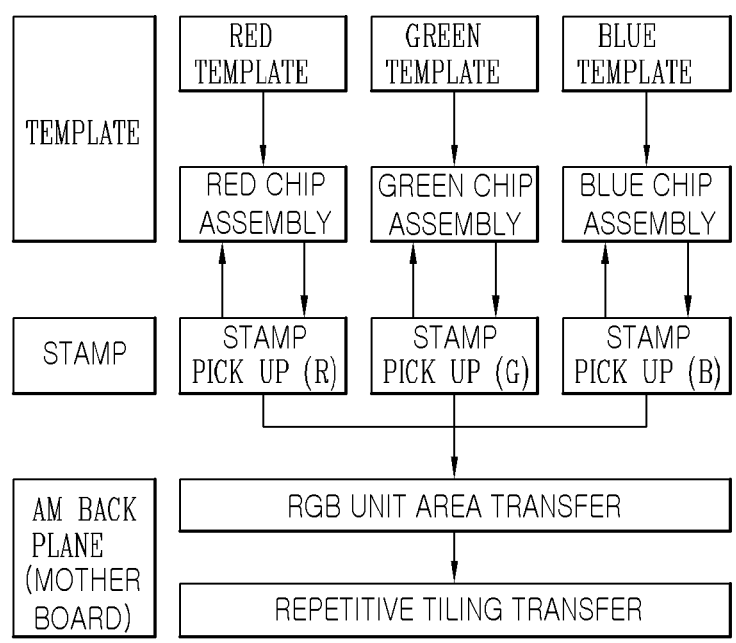

[FIG. 12]
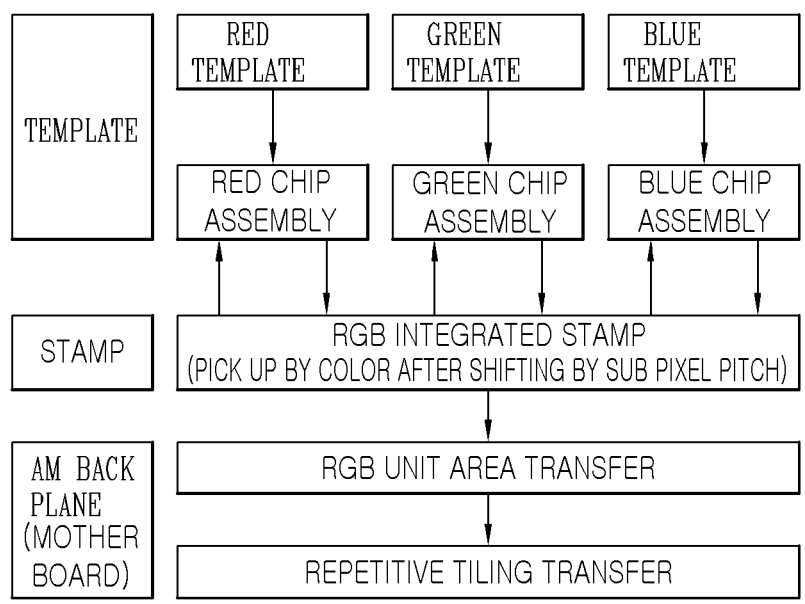

[FIG. 13]
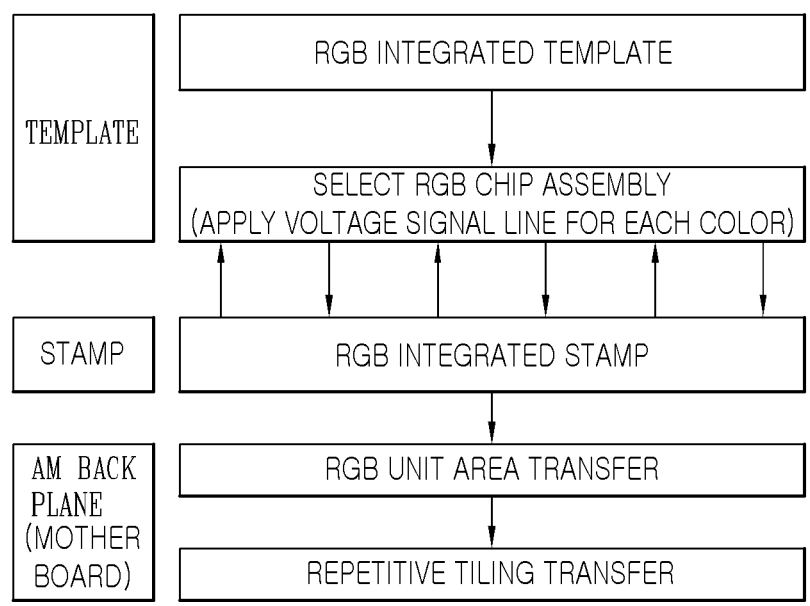

【FIG. 14】
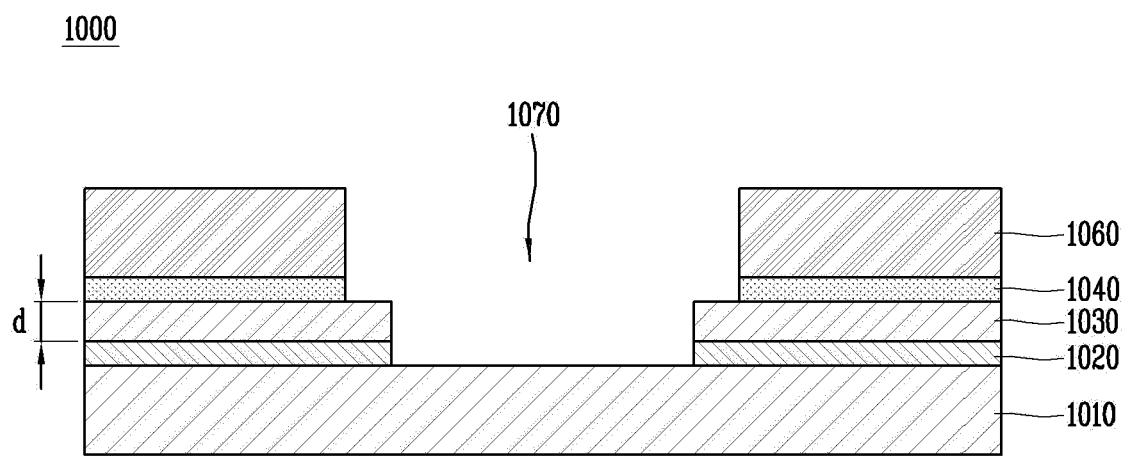
【FIG. 15a】
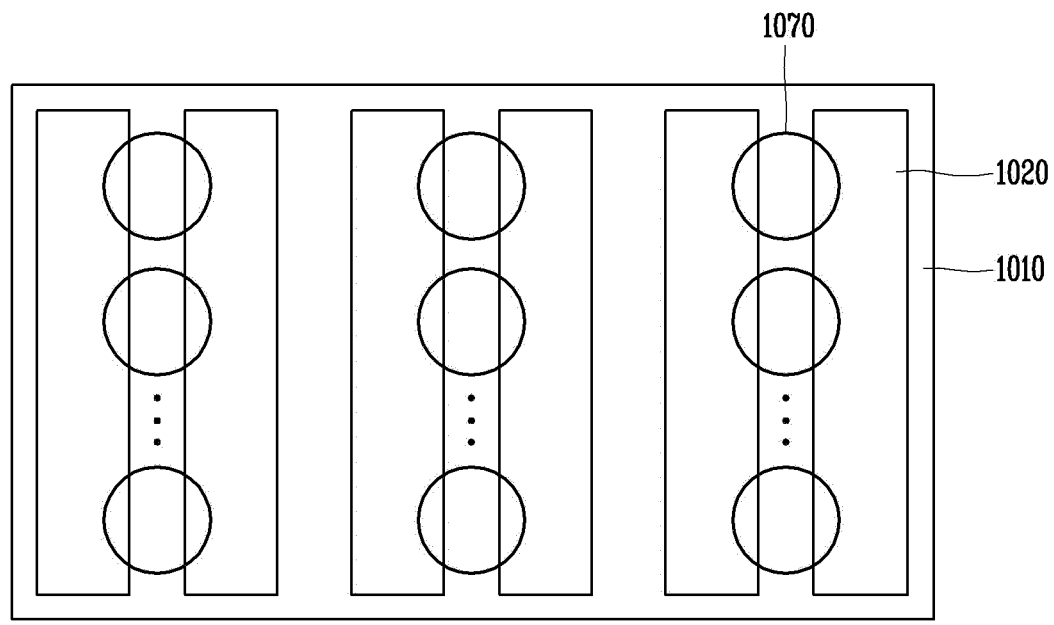

【FIG. 15b】
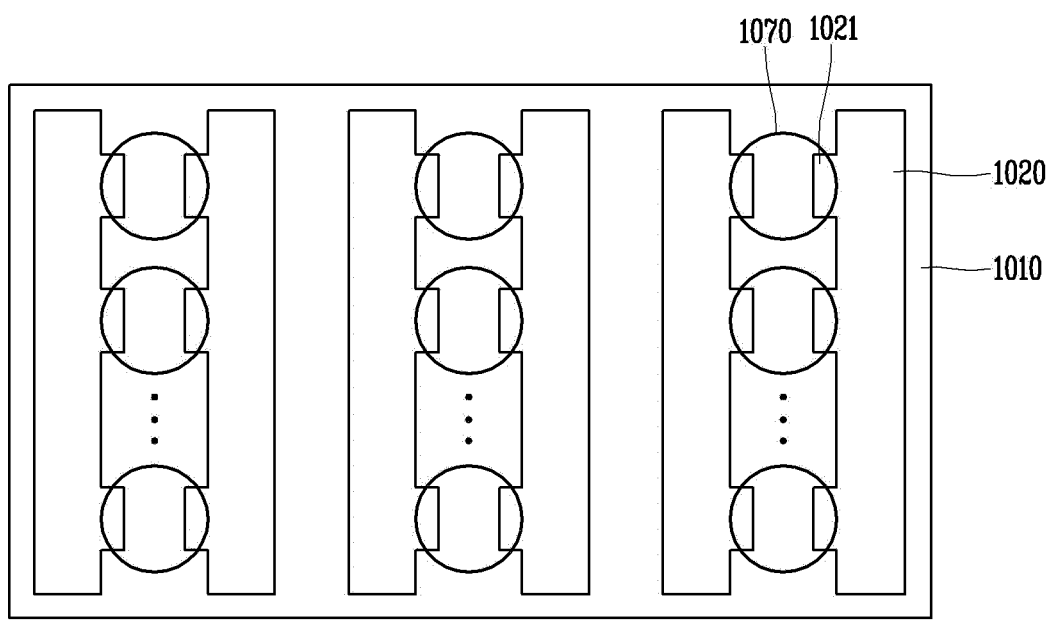
【FIG. 16】
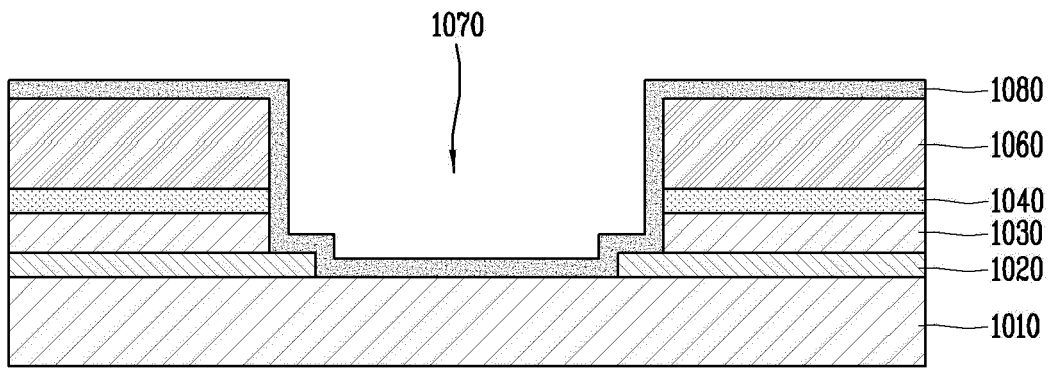

【FIG. 17】
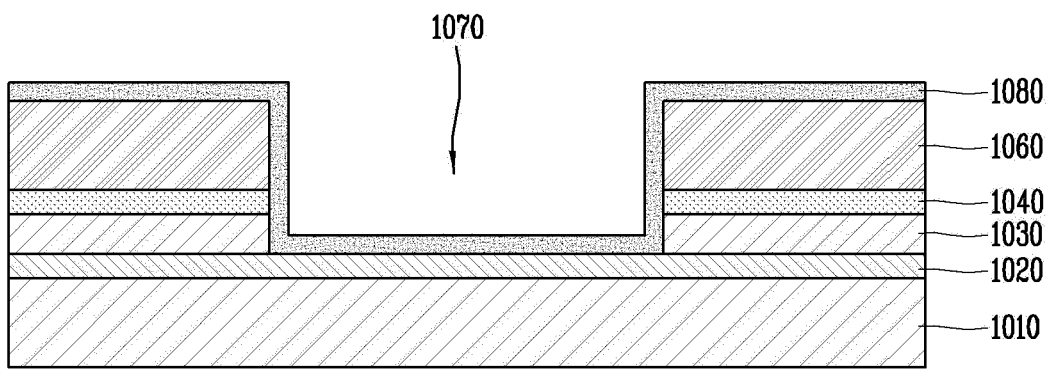
【FIG. 18a】
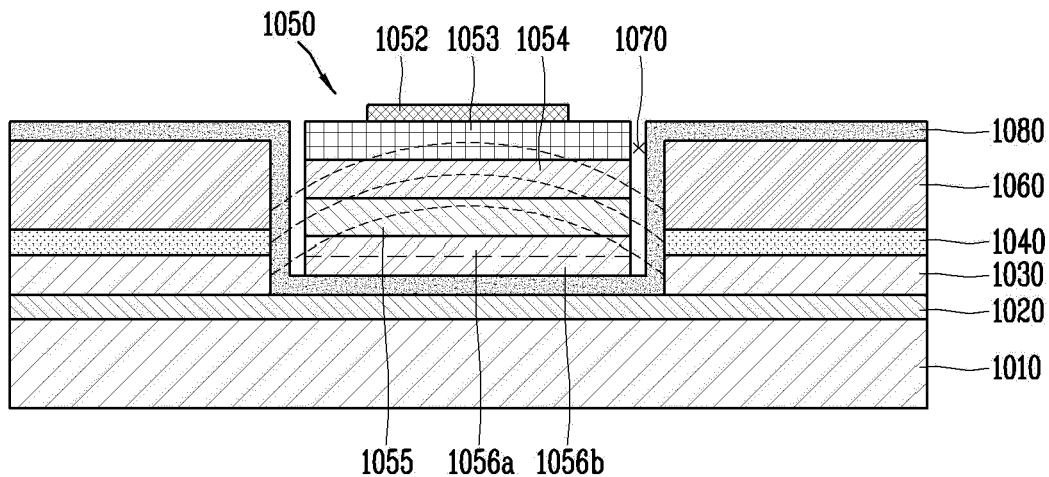

【FIG. 18b】
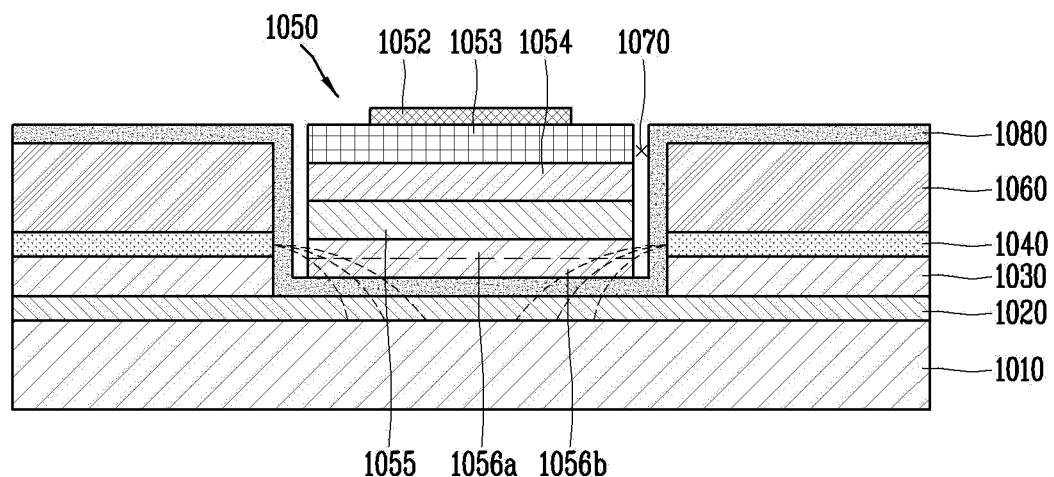
【FIG. 19】
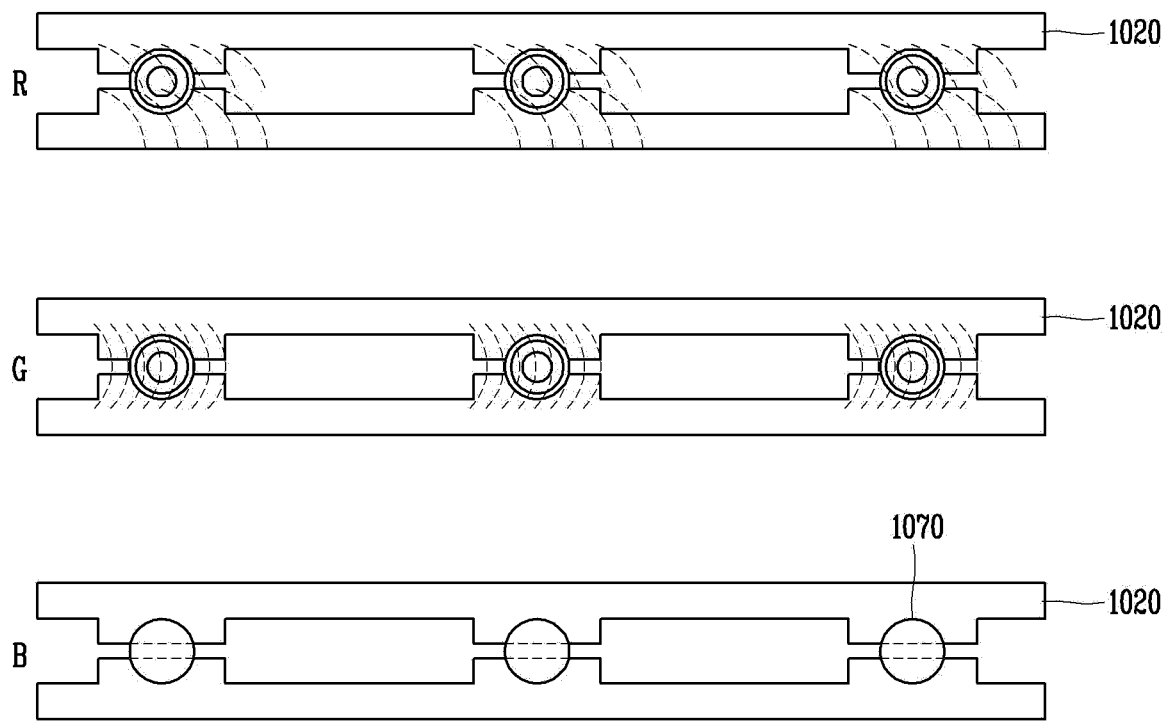

DISPLAY DEVICE HAVING SEMICONDUCTOR LIGHT EMITTING DIODES SEATED IN A PLURALITY OF CELLS, AND METHOD FOR MANUFACTURING THE DISPLAY DEVICE

CROSS REFERENCE TO RELATED APPLICATIONS

This application is the National Stage filing under 35 U.S.C. 371 of International Application No. PCT/KR2019/017957, filed on Dec. 18, 2019, which claims the benefit of earlier filing date and right of priority to Korean Application No. 10-2019-0164884, filed on Dec. 11, 2019, the contents of all these applications are hereby incorporated by reference herein in their entirety.

TECHNICAL FIELD

The present disclosure relates to a display device using a semiconductor light emitting diode and a method for manufacturing the same, and in particular, to a display device using a semiconductor light emitting diode having a size of several to several tens of μm and a method for manufacturing the same.

BACKGROUND ART

Recently, liquid crystal displays (LCD), organic light emitting diode (OLED) displays, and micro LED displays are competing to implement large-area displays in the display technology field.

However, in the case of LCD, there are problems such as non-fast response time and low efficiency of light generated by a backlight, and in the case of OLED, there is a weakness in that the lifespan is short, the mass production yield is not good, and the efficiency is low.

On the other hand, if a semiconductor light emitting diode (micro LED) having a cross-sectional area or diameter of 100 μm or less is used in the display, the display does not absorb light using a polarizing plate or the like, and thus, very high efficiency can be provided. However, since a large display requires millions of semiconductor light emitting diodes, it is difficult to transfer the elements, compared to other technologies.

Examples of a technology that is currently being developed as a transfer process include pick & place, laser lift-off (LLO), or self-assembly. Among them, the self-assembly is a method in which a semiconductor light emitting diode finds its own position in a fluid, and is the most advantageous method for realizing a large-screen display device.

On the other hand, the self-assembly includes a method of directly assembling a semiconductor light emitting diode on a final substrate to be used in a product, and a method of assembling a semiconductor light emitting diode on an assembly substrate and then transferring the semiconductor light emitting diode to a final substrate through an additional transfer process. The method of directly assembling on the final substrate is efficient in terms of process. The use of the assembly substrate has an advantage in that a structure for self-assembly can be added without limitation. Therefore, the two methods are selectively used.

DISCLOSURE OF INVENTION

Technical Problem

An object of the present disclosure is to provide a method for manufacturing a display device, which is capable of improving a self-assembly yield of a semiconductor light emitting diode and minimizing a repair process, and a display device having a structure therefor.

Another object of the present disclosure is to provide a method for manufacturing a display device, which is capable of preventing RGB color mixing when manufacturing a display device composed of RGB.

Technical Solution

A display device according to an embodiment of the present disclosure includes: a base portion; a first electrode formed on the base portion; a dielectric layer stacked on one surface of the first electrode; a second electrode disposed on the dielectric layer at a predetermined interval; a barrier rib portion stacked on the dielectric layer to cover the second electrode while forming a plurality of cells; and semiconductor light emitting diodes seated in the cells, wherein the first electrode is spaced apart from the second electrode with the dielectric layer disposed therebetween.

In the present embodiment, a distance between the first electrode and the second electrode is shorter than a thickness of the semiconductor light emitting diode seated in the cell.

In the present embodiment, the second electrode extends in a first direction, and the first electrode extends in at least a same direction as the second electrode.

In the present embodiment, the second electrode is formed on a partial region of the dielectric layer overlapping the first electrode among entire regions of the dielectric layer.

In the present embodiment, the first electrode extending in the first direction is formed to have a width greater than the second electrode and overlap the cell.

In the present embodiment, the first electrode extending in the first direction includes a protrusion portion protruding inward from the cell to overlap the cell.

In the present embodiment, the first electrode extends in the first direction and a second direction crossing the first direction to cover the base portion.

In the present embodiment, the display device further includes an insulating layer formed along at least an inner surface of the cell.

In the present embodiment, the semiconductor light emitting diode includes: a first conductivity type electrode; a first conductivity type semiconductor layer formed on the first conductivity type electrode; an active layer formed on the first conductivity type semiconductor layer; a second conductivity type semiconductor layer formed on the active layer; and a second conductivity type electrode formed on the second conductivity type semiconductor layer, wherein the first conductivity type electrode is electrically connected to the first electrode.

A method for manufacturing a display device according to an embodiment of the present disclosure is a method for manufacturing a display device, in which semiconductor light emitting diodes put into a chamber containing a fluid are seated at a preset position on a substrate including a first electrode and a second electrode spaced apart from each other with a dielectric layer disposed therebetween by using an electric field and a magnetic field, the method including: applying a voltage to one of the first electrode and the second electrode to seat the semiconductor light emitting diodes at the preset position on the substrate; and after seating the semiconductor light emitting diodes at the preset position, applying a voltage to the first electrode and the second electrode so that the semiconductor light emitting diodes seated at the preset positions are fixed to the preset position.

In the present embodiment, the second electrode includes a plurality of lines extending in a first direction and disposed at predetermined intervals.

In the present embodiment, when semiconductor light emitting diodes emitting light of two or more different colors are assembled on the substrate, a ground voltage is applied to at least some of the plurality of lines of the second electrode according to emission colors of the semiconductor light emitting diodes put into the chamber.

Advantageous Effects

According to an embodiment of the present disclosure, there is an effect that a direction of an electric field may be changed after a semiconductor light emitting diode is assembled, so that the semiconductor light emitting diode is fixed inside a cell more firmly, and a self-assembly yield may be improved by minimizing the semiconductor light emitting diode separated from the cell after the assembly.

In addition, since the direction of the electric field is changed after the semiconductor light emitting diode is assembled, it is possible to prevent leakage of the electric field to the outside of the cell. Therefore, there is an effect that can prevent misassembly of the semiconductor light emitting diode.

Furthermore, there is an effect that can prevent color mixing between RGB when manufacturing a display device composed of RGB by improving the assembly rate of the semiconductor light emitting diode and preventing leakage of the electric field.

BRIEF DESCRIPTION OF DRAWINGS

FIG. 1 is a conceptual diagram illustrating an embodiment of a display device using a semiconductor light emitting diode of the present disclosure.

FIG. 2 is a partially enlarged view of portion A of the display device of FIG. 1.

FIG. 3 is an enlarged view of the semiconductor light emitting diode of FIG. 2.

FIG. 4 is an enlarged view illustrating another embodiment of the semiconductor light emitting diode of FIG. 2.

FIGS. 5a to 5e are conceptual views for describing a new process of manufacturing the semiconductor light emitting diode.

FIG. 6 is a conceptual diagram illustrating an example of a self-assembly apparatus of a semiconductor light emitting diode according to the present disclosure.

FIG. 7 is a block diagram of the self-assembly apparatus of FIG. 6.

FIGS. 8A to 8E are conceptual views illustrating a process of self-assembling a semiconductor light emitting diode using the self-assembly apparatus of FIG. 6.

FIG. 9 is a conceptual diagram for describing the semiconductor light emitting diode of FIGS. 8a to 8e.

FIGS. 10A to 10C are conceptual views illustrating a state in which a semiconductor light emitting diode is transferred after a self-assembly process according to the present disclosure.

FIGS. 11 to 13 are flowcharts illustrating a method of manufacturing a display device including semiconductor light emitting diodes that emit red (R) light, green (G) light, and blue (B) light.

FIG. 14 is a cross-sectional view of a display device according to a first embodiment of the present disclosure.

FIGS. 15a and 15b are views illustrating various embodiments of a first electrode.

FIG. 16 is a cross-sectional view of a display device according to a second embodiment of the present disclosure.

FIG. 17 is a cross-sectional view of a display device according to a third embodiment of the present disclosure.

FIGS. 18a and 18b are conceptual diagrams illustrating a state in which an electric field is formed in a display device according to an embodiment of the present disclosure.

FIG. 19 is a conceptual diagram illustrating a state in which an electric field is formed during RGB assembly in a display device according to an embodiment of the present disclosure.

BEST MODE FOR CARRYING OUT THE INVENTION

Hereinafter, the embodiments disclosed herein will be described in detail with reference to the accompanying drawings, and the same or similar elements are designated with the same numeral references regardless of the numerals in the drawings and their redundant description will be omitted. The suffixes "module" and "unit or portion" for components used in the following description are merely provided only for facilitation of preparing this specification, and thus they are not granted a specific meaning or function. In addition, when it is determined that the detailed description of the related known technology may obscure the gist of embodiments disclosed herein in describing the embodiments, a detailed description thereof will be omitted. Further, it should be noted that the accompanying drawings are only for easy understanding of the embodiments disclosed in the present specification, and should not be construed as limiting the technical spirit disclosed in the present specification by the accompanying drawings. It is also understood that when an element, such as a layer, region, or substrate, it is referred to as being "on" another element, it may be directly present on the other element or intervening elements in between.

The display device described herein may include mobile phones, smart phones, laptop computers, digital broadcasting terminals, personal digital assistants (PDA), portable multimedia players (PMP), navigation systems, slate PCs, a Tablet PC, Ultra Books, digital TVs, digital signages, head mounted displays (HMDs), desktop computers, and the like. However, it will be readily apparent to those skilled in the art that the configuration according to the embodiments described in the present specification may be applied to a device capable of display having even a new product form to be developed later.

FIG. 1 is a conceptual diagram illustrating an embodiment of a display device using a semiconductor light emitting diode of the present disclosure, FIG. 2 is a partially enlarged view of portion A of the display device of FIG. 1, FIG. 3 is an enlarged view of the semiconductor light emitting diode of FIG. 2, and FIG. 4 is an enlarged view illustrating another embodiment of the semiconductor light emitting diode of FIG. 2.

As illustrated, information processed by a controller of a display device 100 may be output from a display module 140. A closed-loop-type case 101 surrounding edges of the display module may form a bezel of the display device.

The display module 140 may include a panel 141 on which images are displayed, and the panel 141 may include a micro-sized semiconductor light emitting diode 150 and a wiring board 110 on which the semiconductor light emitting diode 150 is mounted.

Wirings may be formed on the wiring board 110 to be connected to an n-type electrode 152 and a p-type electrode 156 of the semiconductor light emitting diode 150. Through this, the semiconductor light emitting diode 150 may be provided on the wiring board 110 as an individual pixel that emits light itself.

An image displayed on the panel 141 is visual information, and is implemented by independently controlling light emission of sub-pixels arranged in a matrix form through the wirings.

In the present disclosure, a micro LED (Light Emitting Diode) is exemplified as a type of the semiconductor light emitting diode 150 that converts current into light. The micro LED may be a light emitting diode formed in a small size of 100 micro or less. In the semiconductor light emitting diode 150, blue, red, and green colors are provided in light emitting regions, respectively, and a unit pixel may be realized by a combination thereof. That is, the unit pixel may mean a minimum unit for realizing one color, and at least three micro LEDs may be provided in the unit pixel.

More specifically, referring to FIG. 3, the semiconductor light emitting diode 150 may have a vertical structure.

For example, the semiconductor light emitting diode 150 is mainly made of gallium nitride (GaN), and indium (In) and/or aluminum (Al) are added together to implement a high output light emitting diode that emits various lights including blue.

The vertical semiconductor light emitting diode may include a p-type electrode 156, a p-type semiconductor layer 155 formed on the p-type electrode 156, an active layer 154 formed on the p-type semiconductor layer 155, an n-type semiconductor layer 153 formed on the active layer 154, and an n-type electrode 152 formed on the n-type semiconductor layer 153. In this case, the p-type electrode 156 positioned in a lower portion may be electrically connected to the p-electrode of the wiring board, and the n-type electrode 152 positioned in an upper portion may be electrically connected to the n-electrode at the upper side of the semiconductor light emitting diode. The vertical semiconductor light emitting diode 150 has a great advantage in that it is possible to reduce the chip size because electrodes are arranged up and down.

As another example, referring to FIG. 4, the semiconductor light emitting diode may be a flip chip type light emitting diode.

For this example, the semiconductor light emitting diode 250 may include a p-type electrode 256, a p-type semiconductor layer 255 on which the p-type electrode 256 is formed, an active layer 254 formed on the p-type semiconductor layer 255, an n-type semiconductor layer 253 formed on the active layer 254, and an n-type electrode 252 spaced apart from the p-type electrode 256 in the horizontal direction on the n-type semiconductor layer 253. In this case, both the p-type electrode 256 and the n-type electrode 152 may be electrically connected to the p-electrode and n-electrode of the wiring board under the semiconductor light emitting diode.

The vertical semiconductor light emitting diode and the horizontal semiconductor light emitting diode may be a green semiconductor light emitting diode, a blue semiconductor light emitting diode, or a red semiconductor light emitting diode, respectively. In the case of the green semiconductor light emitting diode and the blue semiconductor light emitting diode, gallium nitride (GaN) is mainly used, and indium (In) and/or aluminum (Al) are added together to implement a high output light emitting diode that emits green or blue light. For this example, the semiconductor light emitting diode may be a gallium nitride thin film formed in various layers such as n-Gan, p-Gan, AlGaN, InGan, etc. Specifically, the p-type semiconductor layer may be P-type GaN, and the n-type semiconductor layer may be N-type GaN. However, in the case of the red semiconductor light emitting diode, the p-type semiconductor layer may be P-type GaAs, and the n-type semiconductor layer may be N-type GaAs.

In addition, the p-type semiconductor layer may be P-type GaN doped with Mg on the p-electrode side, and the n-type semiconductor layer may be N-type GaN doped with Si on the n-electrode side. In this case, the above-described semiconductor light emitting diodes may be semiconductor light emitting diodes having no active layer.

Meanwhile, referring to FIGS. 1 to 4, since the light emitting diodes are very small, unit pixels that emit light themselves may be arranged in a high definition in the display panel, thereby realizing a high-definition display device.

In the display device using the semiconductor light emitting diode of the present disclosure described above, the semiconductor light emitting diode grown on a wafer and formed through mesa and isolation is used as an individual pixel. In this case, the micro-sized semiconductor light emitting diode 150 needs to be transferred to the wafer at a predetermined position on a substrate of the display panel. There is a pick and place technique as such a transfer technique, but the success rate is low and a lot of time is required. As another example, there is a technique of transferring several devices at a time using a stamp or a roll, but it is not suitable for a large screen display due to a limitation in yield. The present disclosure proposes a new manufacturing method and manufacturing apparatus for a display device that can solve these problems.

To this end, a new method of manufacturing a display device will be described below. FIGS. 5a to 5e are conceptual views for describing a new process of manufacturing the semiconductor light emitting diode.

In the present specification, a display device using a passive matrix (PM) type semiconductor light emitting diode is taken as an example. However, the examples described below are also applicable to an active matrix (AM) type semiconductor light emitting diode. In addition, although a method of self-assembling a horizontal semiconductor light emitting diode is described as an example, it is also applicable to a method of self-assembling a vertical semiconductor light emitting diode.

First, according to the manufacturing method, a first conductivity type semiconductor layer 153, an active layer 154, and a second conductivity type semiconductor layer 155 are individually grown on a growth substrate 159 (FIG. 5A).

After the first conductivity type semiconductor layer 153 is grown, the active layer 154 is grown on the first conductivity type semiconductor layer 153, and then the second conductivity type semiconductor layer 155 is grown on the active layer 154. In this way, when the first conductivity type semiconductor layer 153, the active layer 154, and the second conductivity type semiconductor layer 155 are sequentially grown, as shown in FIG. 5A, the first conductivity type semiconductor layer 153, the active layer 154 and the second conductive semiconductor layer 155 form a stacked structure.

In this case, the first conductivity type semiconductor layer 153 may be a p-type semiconductor layer, and the second conductivity type semiconductor layer 155 may be an n-type semiconductor layer. However, the present disclosure is not necessarily limited thereto, and the first conductivity type may be n-type and the second conductivity type may be p-type.

In addition, although the present embodiment exemplifies the case in which the active layer is present, a structure in which the active layer is not present is also possible in some cases as described above. As an example, the p-type semiconductor layer may be P-type GaN doped with Mg, and the n-type semiconductor layer may be N-type GaN doped with Si on the n-electrode side.

The growth substrate 159 (wafer) may be formed of a material having a light-transmitting property, for example, any one of sapphire (Al2O3), GaN, ZnO, and AlO, but is not limited thereto. In addition, the growth substrate 159 may be formed of a material suitable for semiconductor material growth, a carrier wafer. The growth substrate 159 may be formed of a material having excellent thermal conductivity, and may include a conductive board or an insulating board, for example, a SiC board having higher thermal conductivity than a sapphire (Al2O3) board, or use at least one of Si, GaAs, GaP, InP, and Ga2O3.

Next, at least a portion of the first conductivity type semiconductor layer 153, the active layer 154, and the second conductivity type semiconductor layer 155 are removed to form a plurality of semiconductor light emitting diodes (FIG. 5b).

More specifically, isolation is performed such that the plurality of light emitting diodes form a light emitting diode array. That is, the first conductivity type semiconductor layer 153, the active layer 154, and the second conductivity type semiconductor layer 155 are vertically etched to form a plurality of semiconductor light emitting diodes.

In the case of forming a horizontal type semiconductor light emitting diode, a mesa process in which the active layer 154 and the second conductivity type semiconductor layer 155 are partially removed in the vertical direction and the first conductivity type semiconductor layer 153 is exposed to the outside and thereafter, isolation in which the first conductivity type semiconductor layer is etched to form a plurality of semiconductor light emitting diode arrays may be performed.

Next, second conductivity type electrodes 156 (or p-type electrodes) are formed on one surface of the second conductivity type semiconductor layer 155 (FIG. 5c). The second conductive electrode 156 may be formed by a deposition method such as sputtering, but the present disclosure is not limited thereto. However, when the first conductive semiconductor layer and the second conductive semiconductor layer are an n-type semiconductor layer and a p-type semiconductor layer, respectively, the second conductivity type electrode 156 may be an n-type electrode.

Then, the growth substrate 159 is removed to provide a plurality of semiconductor light emitting diodes. For example, the growth substrate 159 may be removed using a laser lift-off (LLO) method or a chemical lift-off (CLO) method (FIG. 5d).

Thereafter, the semiconductor light emitting diodes 150 are seated on a board in a chamber filled with a fluid (FIG. 5e).

For example, the semiconductor light emitting diodes 150 and the board are put in the chamber filled with a fluid, and the semiconductor light emitting diodes are self-assembled onto the board 161 using flow, gravity, surface tension, and the like. In this case, the board may be an assembled board 161.

As another example, it is also possible to put the wiring board in a fluid chamber instead of the assembly board 161 so that the semiconductor light emitting diodes 150 are directly seated on the wiring board. In this case, the board may be a wiring board. However, for convenience of description, in the present disclosure, the board is provided as, for example, the assembly board 161 on which the semiconductor light emitting diodes 1050 are seated.

Cells (not shown) in which the semiconductor light emitting diodes 150 are inserted may be provided in the assembly board 161 to facilitate mounting of the semiconductor light emitting diodes 150 on the assembly board 161. Specifically, cells in which the semiconductor light emitting diodes 150 are seated are formed in the assembly board 161 at positions where the semiconductor light emitting diodes 150 are to be aligned with wiring electrodes. The semiconductor light emitting diodes 150 are assembled to the cells while moving in the fluid.

After a plurality of semiconductor light emitting diodes are arrayed on the assembly board 161, the semiconductor light emitting diodes of the assembly board 161 are transferred to a wiring board, enabling large-area transfer. Accordingly, the assembly board 161 may be referred to as a temporary board.

On the other hand, in order to apply the self-assembly method described above to the manufacture of a large-screen display, it is necessary to increase transfer yield. The present disclosure proposes a method and apparatus for minimizing the influence of gravity or frictional force and preventing non-specific binding in order to increase the transfer yield.

In this case, in the display device according to the present disclosure, a magnetic material is disposed on the semiconductor light emitting diode to move the semiconductor light emitting diode using magnetic force, and the semiconductor light emitting diode is seated at a predetermined position by using an electric field during movement. Hereinafter, the transfer method and apparatus will be described in more detail with the accompanying drawings.

FIG. 6 is a conceptual diagram illustrating an example of a self-assembly apparatus of a semiconductor light emitting diode according to the present disclosure, and FIG. 7 is a block diagram of the self-assembly apparatus of FIG. 6. FIGS. 8A to 8E are conceptual views illustrating a process of self-assembling a semiconductor light emitting diode using the self-assembly apparatus of FIG. 6, and FIG. 9 is a conceptual diagram for describing the semiconductor light emitting diode of FIGS. 8A to 8E.

Referring to FIGS. 6 and 7, a self-assembly apparatus 160 of the present disclosure may include a fluid chamber 162, a magnet 163 and a position control unit 164.

The fluid chamber 162 has a space for accommodating a plurality of semiconductor light emitting diodes. The space may be filled with a fluid, and the fluid may include water or the like as an assembly solution. Accordingly, the fluid chamber 162 may be a water tank and may be configured in an open type. However, the present disclosure is not limited thereto, and the fluid chamber 162 may be of a closed type in which the space is a closed space.

The board 161 may be disposed in the fluid chamber 162 such that an assembly surface on which the semiconductor light emitting diodes 150 are assembled faces downward. For example, the board 161 may be transferred to an assembly position by a transfer device, and the transfer device may include a stage 165 on which the board is mounted. The position of the stage 165 is controlled by the control unit, and through this, the board 161 may be transferred to the assembly position.

In this case, in the assembly position, the assembly surface of the board 161 faces the bottom of the fluid chamber 150. As shown, the assembly surface of the board 161 is disposed to be immersed in the fluid in the fluid chamber 162. Accordingly, the semiconductor light emitting diode 150 moves to the assembly surface in the fluid.

The board 161 is an assembly board in which an electric field is able to be formed, and may include a base portion 161a, a dielectric layer 161b, and a plurality of electrodes 161c.

The base portion 161a may be formed of an insulating material, and the plurality of electrodes 161c may be a thin or thick bi-planar electrode patterned on one surface of the base portion 161a. The electrode 161c may be formed of, for example, a stack of Ti/Cu/Ti, Ag paste, and ITO.

The dielectric layer 161b may be formed of an inorganic material such as $SiO_2$, $SiN_x$, $SiON$, $Al_2O_3$, $TiO_2$, $HfO_2$, or the like. Alternatively, the dielectric layer 161b may be comprised of a single layer or a multi-layer as an organic insulator. The dielectric layer 161b may have a thickness of several tens of nm to several μm.

Furthermore, the board 161 according to the present disclosure includes a plurality of cells 161d separated by barrier ribs. The cells 161d are sequentially arranged in one direction and may be made of a polymer material. Also, the barrier ribs 161e defining the cells 161d are shared with the neighboring cells 161d. The barrier ribs 161e may protrude from the base portion 161a, and the cells 161d may be sequentially arranged along one direction by the barrier ribs 161e. More specifically, the cells 161d are sequentially arranged in the column and row directions, respectively, and may have a matrix structure.

As shown, the cell 161d may have a groove for accommodating the semiconductor light emitting diode 150 and the groove may be a space defined by the barrier ribs 161e. The shape of the groove may be the same as or similar to that of the semiconductor light emitting diode. For example, when the semiconductor light emitting diode has a rectangular shape, the groove may have a rectangular shape. Also, although not shown, when the semiconductor light emitting diode has a circular shape, the groove formed in the cells may have a circular shape. Furthermore, each of the cells is configured to accommodate a single semiconductor light emitting diode. That is, one semiconductor light emitting diode is accommodated in one cell.

Meanwhile, the plurality of electrodes 161c may include a plurality of electrode lines disposed at the bottom of each of the cells 161d, and the plurality of electrode lines may extend to adjacent cells.

The plurality of electrodes 161c are disposed below the cells 161d, and different polarities are applied to the electrodes 161c to generate an electric field in the cells 161d. To form the electric field, the dielectric layer may form the bottom of the cells 161d while the dielectric layer is covering the plurality of electrodes 161c. In this structure, when different polarities are applied to the pair of electrodes 161c under the cells 161d, an electric field is formed, and the semiconductor light emitting diodes may be inserted into the cells 161d due to the electric field.

In the assembly position, the electrodes of the board 161 are electrically connected to a power supply device 171. The power supply device 171 may apply power to the plurality of electrodes to generate the electric field.

As shown, the self-assembly apparatus may include a magnet 163 for applying a magnetic force to the semiconductor light emitting diodes. The magnet 163 is spaced apart from the fluid chamber 162 to apply a magnetic force to the semiconductor light emitting diodes 150. The magnet 163 may be disposed to face the opposite surface of the assembly surface of the board 161, and the position of the magnet is controlled by the position control unit 164 connected to the magnet 163.

The semiconductor light emitting diode 1050 may include a magnetic material to move in the fluid due to the magnetic field of the magnet 163.

Referring to FIG. 9, a semiconductor light emitting diode including a magnetic material may include a first conductivity type electrode 1052, a second conductivity type electrode 1056, a first conductivity type semiconductor layer 1053 on which the first conductivity type electrode 1052 is disposed, a second conductivity type semiconductor layer 1055 on which the second conductivity type electrode 1056 is disposed, the second conductivity type semiconductor layer 1055 overlapping the first conductivity type semiconductor layer 1052 and an active layer 1054 disposed between the first and second conductivity type semiconductor layers 1053 and 1055.

Here, the first conductivity type may be p-type, the second conductivity type may be n-type, and vice versa. In addition, as described above, the semiconductor light emitting diode having no active layer may be used.

Meanwhile, in the present disclosure, the first conductivity type electrode 1052 may be generated after the semiconductor light emitting diode is assembled to the wiring board through self-assembly of the semiconductor light emitting diode. Also, in the present disclosure, the second conductivity type electrode 1056 may include the magnetic material. The magnetic material may mean a magnetic metal. The magnetic material may be Ni, SmCo, or the like, and as another example, may include a material corresponding to at least one of Gd-based, La-based, and Mn-based materials.

The magnetic material may be provided in the second conductivity type electrode 1056 in the form of particles. Alternatively, the conductivity type electrode including a magnetic material may have one layer formed of a magnetic material. For this example, as shown in FIG. 9, the second conductivity type electrode 1056 of the semiconductor light emitting diode 1050 may include a first layer 1056a and a second layer 1056b. Here, the first layer 1056a may include a magnetic material, and the second layer 1056b may include a metal material rather than a magnetic material.

As shown, in this example, the first layer 1056a including a magnetic material may be disposed to contact the second conductivity type semiconductor layer 1055. In this case, the first layer 1056a is disposed between the second layer 1056b and the second conductivity type semiconductor layer 1055. The second layer 1056b may be a contact metal connected to the second electrode of the wiring board. However, the present disclosure is not necessarily limited thereto, and the magnetic material may be disposed on one surface of the first conductivity type semiconductor layer.

Referring back to FIGS. 6 and 7, more specifically, the self-assembly apparatus is provided with a magnet handler that is movable automatically or manually in the x, y, and z axes on the upper portion of the fluid chamber, or a motor capable of rotating the magnet 163. The magnet handler and the motor may constitute the position control unit 164. Through this, the magnet 163 may rotate in a horizontal direction with the board 161, clockwise or counterclockwise direction.

Meanwhile, a bottom plate 166 having a light-transmitting property may be formed in the fluid chamber 162, and the semiconductor light emitting diodes may be disposed between the bottom plate 166 and the board 161. An image sensor 167 may be disposed to face the bottom plate 166 to monitor the inside of the fluid chamber 162 through the bottom plate 166. The image sensor 167 is controlled by the control unit 172 and may include an inverted type lens, a CCD and the like to observe the assembly surface of the board 161.

The self-assembly apparatus described above is configured to use a combination of a magnetic field and an electric field, and when using this, the semiconductor light emitting diodes may be seated at predetermined positions on the board due to an electric field while moving by a change in the position of the magnet. Hereinafter, an assembly process using the self-assembly apparatus described above will be described in more detail.

First, a plurality of semiconductor light emitting diodes 1050 including a magnetic material are formed through the process described with reference to FIGS. 5A to 5C. In this case, in the process of forming the second conductivity type electrode of FIG. 5C, a magnetic material may be deposited on the semiconductor light emitting diode.

Next, the board 161 is transferred to an assembly position, and the semiconductor light emitting diodes 1050 are put into the fluid chamber 162 (FIG. 8*a*).

As described above, the assembly position of the board 161 may be a position in which the board 161 is to be disposed in the fluid chamber 162 such that the assembly surface of the board 161 on which the semiconductor light emitting diodes 1050 are to be assembled faces downward.

In this case, some of the semiconductor light emitting diodes 1050 may sink to the bottom of the fluid chamber 162 and some may float in the fluid. The bottom plate 166 having a light-transmitting property is provided in the fluid chamber 162, and some of the semiconductor light emitting diodes 1050 may sink to the bottom plate 166.

Next, a magnetic force is applied to the semiconductor light emitting diodes 1050 such that the semiconductor light emitting diodes 1050 vertically float in the fluid chamber 162 (FIG. 8*b*)

When the magnet 163 of the self-assembly apparatus moves from its original position to the opposite surface of the assembly surface of the board 161, the semiconductor light emitting diodes 1050 may float toward the board 161 in the fluid. The original position may be a position deviated from the fluid chamber 162. As another example, the magnet 163 may be made of an electromagnet. In this case, electricity is supplied to the electromagnet to generate an initial magnetic force.

Meanwhile, in this example, when the magnitude of the magnetic force is adjusted, the separation distance between the assembly surface of the board 161 and the semiconductor light emitting diodes 1050 may be controlled. For example, the separation distance is controlled using the weight, buoyancy, and magnetic force of the semiconductor light emitting diodes 1050. The separation distance may be several millimeters to several tens of micrometers from the outermost edge of the board.

Next, a magnetic force is applied to the semiconductor light emitting diodes 1050 such that the semiconductor light emitting diodes 1050 move in one direction in the fluid chamber 162. For example, it is possible to move the magnet 163 in a direction horizontal to the board, clockwise or counterclockwise (FIG. 8*c*). In this case, the semiconductor light emitting diodes 1050 move in a direction parallel to the board 161 from positions spaced apart from the board 161 due to the magnetic force.

Next, an electric field is applied to guide the semiconductor light emitting diodes 1050 to preset positions such that the semiconductor light emitting diodes 1050 are seated in the preset positions of the board 161 while the semiconductor light emitting diodes 1050 are moving (FIG. 8*c*). For example, while the semiconductor light emitting diodes 1050 are moving in a direction horizontal to the board 161, the semiconductor light emitting diodes 1050 may move in a direction perpendicular to the board 161 due to the electric field, and be then seated in the preset positions of the board 161.

More specifically, an electric field is generated by supplying power to the bi-planar electrode of the board 161 to enable assembly to be made only at preset positions. That is, the semiconductor light emitting diodes 1050 are self-assembled at assembly positions of the board 161 by using the selectively generated electric field. To this end, cells in which the semiconductor light emitting diodes 1050 are inserted may be provided in the board 161.

Thereafter, a process of unloading the board 161 is performed, and the assembly process is finished. When the board 161 is an assembly board, a post-process for realizing a display device by transferring the semiconductor light emitting diodes arranged as described above to a wiring board may be performed.

Meanwhile, after guiding the semiconductor light emitting diodes 1050 to the preset positions, the magnet 163 may be moved in a direction away from the board 161 such that the semiconductor light emitting diodes 1050 remaining in the fluid chamber 162 fall to the bottom of the fluid chamber 162 (FIG. 8*d*). As another example, when power supply is stopped in a case where the magnet 163 is an electromagnet, the semiconductor light emitting diodes 1050 remaining in the fluid chamber 162 may fall to the bottom of the fluid chamber 162.

Thereafter, when the semiconductor light emitting diodes 1050 at the bottom of the fluid chamber 162 are recovered, the recovered semiconductor light emitting diodes 1050 may be reused.

The self-assembly apparatus and method described above may use a magnetic field to enable distant parts to congregate near a predetermined assembly site and apply a separate electric field to the assembly site such that the parts are selectively assembled only to the assembly site in order to increase the assembly yield in fluidic assembly. In this case, the assembly board is placed on the upper portion of the water tank and the assembly surface is directed downward to minimize the effect of gravity due to the weight of the parts and prevent non-specific binding to eliminate defects. That is, to increase the transfer yield, the assembly board is placed on the upper portion to minimize the effect of gravity or frictional force, and to prevent non-specific binding.

As described above, according to the present disclosure having the above configuration, in a display device in which individual pixels are formed of semiconductor light emitting diodes, a large number of semiconductor light emitting diodes may be assembled at once.

As described above, according to the present disclosure, it is possible to pixelate a large amount of semiconductor light emitting diodes on a small-sized wafer and then transfer the semiconductor light emitting diodes to a large-area substrate. Through this, it is possible to manufacture a large-area display device at a low cost.

Hereinafter, a display device using a semiconductor light emitting diode having a novel structure according to an embodiment of the present disclosure and a method for manufacturing the same will be described with reference to the accompanying drawings.

The display device described below may be used as an assembly substrate and a final substrate. In addition, when the display device described below is a final substrate, the display device is applicable to both a passive matrix (PM) display device and an active matrix (AM) display device.

According to the display device and the method for manufacturing the same according to the present disclosure, the self-assembly yield of the semiconductor light emitting diode may be improved by changing the electric field formation path according to the self-assembly state, and furthermore, the repair process may be minimized.

FIG. 14 is a cross-sectional view of a display device according to a first embodiment of the present disclosure, FIGS. 15a and 15b are views illustrating various embodiments of a first electrode, FIG. 16 is a cross-sectional view of a display device according to a second embodiment of the present disclosure, and FIG. 17 is a cross-sectional view of a display device according to a third embodiment of the present disclosure.

According to an embodiment of the present disclosure, a display device 1000 may include a base portion 1010, a first electrode 1020, a dielectric layer 1030, a second electrode 1040, a semiconductor light emitting diode 1050, and a barrier rib portion 1060.

The base portion 1010 may be made of a transparent material or an opaque material. In addition, the base portion 1010 may be made of a material including glass and polyimide (PI) in order to implement a flexible display device, and any insulating and flexible material may be used.

The first electrode 1020 may be formed on the base portion 1010. The first electrode 1020 may be a bar-shaped or plane-shaped electrode patterned on one surface of the base portion 1010. That is, the first electrode 1020 may have a shape extending in at least one direction, and may have a shape extending in the same direction as at least the second electrode 1040 described below. In addition, the first electrode 1020 may include a single-layer or multi-layer metal thin film, a metal paste, or a transparent electrode such as indium tin oxide (ITO), indium zinc oxide (IZO), or $In_2O_3$.

The dielectric layer 1030 may be stacked on all of part of one surface of the first electrode 1020. The dielectric layer 1030 may be made of an inorganic insulating material such as $SiO_2$, $SiN_x$, $Al_2O_3$, $TiO_2$, or $HfO_2$.

The second electrode 1040 may be disposed on the dielectric layer 1030. For example, the second electrode 1040 may be formed in a bar shape extending in a first direction, may be disposed at predetermined intervals, and may include a plurality of electrode lines. The plurality of electrode lines may form a pair of pair electrodes between lines arranged adjacent to each other.

In addition, the second electrode 1040 may be formed on a partial region of the dielectric layer 1030 overlapping the first electrode 1020 among the entire regions of the dielectric layer 1030. That is, the second electrode 1040 may not be formed on the region of the dielectric layer 1030 that does not overlap the first electrode 1020.

The barrier rib portion 1060 may be stacked on the dielectric layer 1030 to cover the second electrode 1040 while forming cells 1070 at predetermined intervals in the extending direction of the second electrode 1040. The cells 1070 may be formed in a region between the second electrodes 1040 adjacent to each other, specifically, in a region between the pair electrodes, at predetermined intervals in the extending direction of the second electrodes 1040. In addition, the barrier rib portion 1060 may be made of the same inorganic insulating material as the dielectric layer 1030, or may be made of an organic insulating material.

On the other hand, the semiconductor light emitting diode 1050 may be seated in the cell 1070. For example, the semiconductor light emitting diode 1050 may be a horizontal or vertical semiconductor light emitting diode including a magnetic material, and may have a symmetrical structure for self-assembly. Preferably, the semiconductor light emitting diode 1050 seated in the cell 1070 may be a vertical semiconductor light emitting diode illustrated in FIG. 9.

The vertical semiconductor light emitting diode may include a first conductivity type electrode 1056b, a first conductivity type semiconductor layer 1055 formed on the first conductivity type electrode 1056b, an active layer 1054 formed on the first conductivity type semiconductor layer 1055, a second conductivity type semiconductor layer 1053 formed on the active layer 1054, and a second conductivity type electrode 1052 formed on the second conductivity type semiconductor layer 1053. In the vertical semiconductor light emitting diode, the first conductivity type electrode 1056b and the second conductivity type electrode 1052 may be disposed on different surfaces. Therefore, the semiconductor light emitting diode 1050 may have a structure advantageous for miniaturization.

According to an embodiment of the present disclosure, a voltage for forming an electric field may be applied to the first electrode 1020 and the second electrode 1040. That is, the display device 1000 according to an embodiment of the present disclosure may have a structure including the first electrode 1020 and the second electrode 1040 as electrodes for forming an electric field.

In the display device 1000 according to an embodiment of the present disclosure, the first electrode 1020 and the second electrode 1040 may be spaced apart from each other with the dielectric layer 1030 disposed therebetween (spaced apart in the stacking direction based on the drawing).

A distance between the first electrode 1020 and the second electrode 1040 may be determined by a thickness d of the dielectric layer 1030. The thickness d of the dielectric layer 1030 may be several to several tens of μm in consideration of the thickness (or height) of the semiconductor light emitting diode 1050 seated inside the cell 1070.

Specifically, the thickness d of the dielectric layer 1030 may be thinner (or shorter) than the thickness of the semiconductor light emitting diode 1050. Accordingly, an electric field formed by applying a voltage to the first electrode 1020 and the second electrode 1040 may be prevented from leaking to the outside of the cell 1070.

On the other hand, the first electrode 1020 may extend in the same direction as at least the second electrode 1040. Hereinafter, various embodiments of the first electrode 1020 will be described.

Referring to FIG. 15a, the first electrode 1020 may be formed in a bar shape extending in the same direction as the extending direction of the second electrode 1040, that is, in the first direction. Accordingly, the cells 1070 may be disposed at predetermined intervals in the same direction as the extending direction of the first electrode 1020. In this case, the first electrode 1020 is formed in a bar shape having a width greater than that of the second electrode 1040, so that a portion of the first electrode 1020 may overlap the cell 1070.

Referring to FIG. 15b, the first electrode 1020 may be formed in a bar shape extending in the same direction as the extending direction of the second electrode 1040, that is, in the first direction, and include a protrusion portion 1021 protruding inward from the cell 1070. That is, in the present embodiment, the protrusion portion 1021 of the first electrode 1020 may overlap the cell 1070.

In another embodiment, as illustrated in FIG. 17, the first electrode 1020 may be formed in a plane shape extending in the first direction and the second direction crossing the first direction to cover the base portion 1010. In this case, the first electrode 1020 may be a metal electrode or a transparent electrode described above.

The plane-shaped electrode may be formed on the base portion 1010 without a photolithography process. For example, when the first electrode 1020 is the metal electrode, the first electrode 1020 may be formed on the base portion 1010 through a sputtering process. When the first electrode 1020 is the transparent electrode, the first electrode 1020 may be formed on the base portion 1010 through a spray process. Therefore, there is an advantage in terms of simplifying a manufacturing process and reducing manufacturing costs.

Furthermore, the structure of the first electrode 1020 formed to cover one surface of the base portion 1010 has an advantageous effect when assembling the miniaturized semiconductor light emitting diode 1050, for example, the semiconductor light emitting diode 1050 having a size of 30 μm or less.

Specifically, as the size of the semiconductor light emitting diode 1050 decreases, the gap between the first electrodes 1020 having the bar shape patterned at an interval of about 20 μm has to be further narrowed. However, a current process has a limitation in narrowing the gap between the first electrodes 1020. Accordingly, the structure of the first electrode 1020 formed to cover one surface of the base portion 1010 may be suitable for assembling the miniaturized semiconductor light emitting diode 1050.

On the other hand, as in the above-described embodiments of the first electrode 1020, when the first electrode 1020 is formed to overlap the cell 1070, an electric field area may be maximized, and the semiconductor light emitting diode 1050 assembled in the cell 1070 may be more strongly fixed inside the cell 1070.

On the other hand, according to an embodiment of the present disclosure, an insulating layer 1080 formed along at least an inner surface of the cell 1070 may be further included. Preferably, the insulating layer 1080 may extend from one surface of the barrier rib portion 1060 to the inner surface of the cell 1070 to cover the first electrode 1020 overlapping the cell 1070. The insulating layer 1080 may be made of an inorganic insulating material like the dielectric layer 1030.

The structure of the display device 1000 according to an embodiment of the present disclosure may form an electric field having a shape as illustrated in FIGS. 18a and 18b.

FIGS. 18a and 18b are conceptual diagrams illustrating a state in which the electric field is formed in the display device according to an embodiment of the present disclosure.

As illustrated in FIG. 18a, the electric field may be formed in the width direction (or horizontal direction) of the cell 1070. The horizontal electric field may be formed to guide the semiconductor light emitting diode 1050 to the cell 1070 so that the semiconductor light emitting diode 1050 is seated inside the cell 1070 during self-assembly.

In order to form the horizontal electric field, a voltage may be applied to only one of the first electrode 1020 and the second electrode 1040. For example, when a voltage is applied only to the second electrode 1040 formed in a bar shape, or when the first electrode 1020 is formed in a bar shape, a voltage may be applied only to the first electrode 1020 instead of the second electrode 1040.

The first electrode 1020 and/or the second electrode 1020 formed in a bar shape may include a plurality of electrode lines, and pair electrodes may be formed between two adjacent electrode lines. On the other hand, the cell 1070 in which the semiconductor light emitting diode 1050 is seated may be formed between the pair electrodes. In this case, an electric field may be formed in the cell 1070 by applying voltages of different polarities to the pair electrodes.

According to an embodiment of the present disclosure, as illustrated in FIG. 18b, the electric field may be formed in the height direction (or vertical direction) of the cell 1070. The vertical electric field may be formed so that the semiconductor light emitting diode 1050 seated inside the cell 1070 after self-assembly is fixed to the cell 1070. That is, the electric field formed in the horizontal direction during the self-assembly may be changed to the vertical direction after the self-assembly.

In order to form the vertical electric field, a voltage may be simultaneously applied to the first electrode 1020 and the second electrode 1040. In this case, an electric field may be formed inside the cell 1070 by applying voltages of different polarities to the first electrode 1020 and the second electrode 1040.

On the other hand, as illustrated in FIGS. 18a and 18b, the semiconductor light emitting diode 1050 seated in the cell 1070 may be electrically connected to the first electrode 1020. That is, the first electrode 1020 may be used as an assembly electrode for self-assembly of the semiconductor light emitting diode 1050, and may also serve as a wiring electrode to be electrically connected to the semiconductor light emitting diode 1050.

Although not specifically shown in the drawings, the insulating layer 1080 covering the bottom surface of the cell 1070 may include a solder portion for electrically connecting the first electrode 1020 and the first conductivity type electrode 1056b of the semiconductor light emitting diode 1050. The solder portion may be formed by filling a conductive material such as a metal, but the present disclosure is not limited thereto.

Hereinafter, a method for manufacturing a display device according to an embodiment of the present disclosure will be described.

The method for manufacturing the display device according to the embodiment of the present disclosure may be a self-assembly method using an electric field and a magnetic field, and may be performed in a fluid.

First, a step of putting the semiconductor light emitting diodes 1050 emitting light of predetermined colors into a chamber containing a fluid may be performed. For example, the semiconductor light emitting diodes 1050 emitting light of one of red, green, and blue colors may be put into the chamber.

Next, a step of transferring the substrate, on which the semiconductor light emitting diodes 1050 put into the chamber are to be assembled, to a preset position may be performed.

In the present embodiment, a substrate including the first electrode 1020 and the second electrode 1040 spaced apart from each other with the dielectric layer 1030 disposed therebetween may be used. Specifically, the second electrode 1040 may include a plurality of bar-shaped electrode lines extending in the first direction and disposed at predetermined intervals, and the first electrode 1020 may include a plurality of bar-shaped electrode lines like the second electrode, or may be formed in the form of one plane electrode.

On the other hand, the substrate having the above-described structure may be disposed to be immersed in the fluid in the chamber.

Next, a step of applying a magnetic field so that the semiconductor light emitting diodes 1050 put into the chamber move in one direction may be performed. Specifically, a magnetic force may be applied to the semiconductor light emitting diodes 1050 by using a magnet array disposed on the other side of the assembly surface of the substrate. The assembly surface may refer to a surface including structures for assembling the semiconductor light emitting diodes 1050 as described above, for example, the first electrode 1020 and the second electrode 1040.

Next, a step of forming an electric field for seating the moving semiconductor light emitting diodes 1050 at a preset position on the substrate may be performed. The preset position may refer to the cell 1070.

Specifically, a step of applying a voltage to one of the first electrode 1020 and the second electrode 1040 to seat the semiconductor light emitting diodes 1050 at a preset position on the substrate, that is, the cell 1070 may be performed. For example, when the first electrode 1020 has a bar shape like the second electrode 1040, a voltage may be applied to the first electrode 1020 or the second electrode 1040, and when the first electrode 1020 has a plane shape, a voltage may be applied to the second electrode 1040. At this time, the path of the formed electric field is illustrated in FIG. 18*a*.

Next, after the semiconductor light emitting diodes 1050 are seated at a preset position, a step of forming an electric field to fix the seated semiconductor light emitting diodes 1050 may be performed. In this step, a voltage may be applied to both the first electrode 1020 and the second electrode 1040 to form an electric field along the path as illustrated in FIG. 18*b*.

On the other hand, when assembling the semiconductor light emitting diodes 1050 emitting red light, green light, and blue light on the substrate, assembly may be performed for each color. For example, after assembling the red (R) semiconductor light emitting diodes 1050, the green (G) semiconductor light emitting diodes 1050 may be assembled. Finally, the blue (B) semiconductor light emitting diodes 1050 may be assembled.

In this case, the semiconductor light emitting diodes 1050 that emit red (R) light, green (G) light, and blue (B) light may be assembled on different preset lines, and the respective lines may be sequentially and repeatedly disposed.

FIG. 19 is a conceptual diagram illustrating a state in which an electric field is formed during RGB assembly in a display device according to an embodiment of the present disclosure.

Referring to FIG. 19, when assembling the semiconductor light emitting diodes 1050 that emit light of two or more different colors on the above-described substrate, different types of electric field may be formed for each line in which a specific color is assembled.

FIG. 19 is a view illustrating a state of an electric field formed on a substrate when assembling a green (G) semiconductor light emitting diode. In this case, the green (G) semiconductor light emitting diodes 1050 may be in a state of being put into the chamber.

For example, a vertical electric field for fixing the assembled semiconductor light emitting diodes 1050 may be formed in the assembly lines of the assembled red (R) semiconductor light emitting diodes 1050, and a horizontal electric field for seating the semiconductor light emitting diodes 1050 may be formed in the assembly lines of the green (G) semiconductor light emitting diodes 1050 that are being assembled. In addition, a ground voltage may be applied to the assembly lines of the blue (B) semiconductor light emitting diodes 1050 that are in a pre-assembly state.

That is, a ground voltage may be applied to at least some of the plurality of lines of the second electrode 1040 according to the emission color of the semiconductor light emitting diodes 1050 put into the chamber. When the first electrode 1020 is formed in a bar shape like the second electrode 1040, a ground voltage may be applied to some lines of the first electrode 1020 and the second electrode 1040. The lines to which the ground voltage is applied may be lines overlapping the cells 1070 to which the semiconductor light emitting diodes 1050 are not yet assembled.

The electrode pad for applying the ground voltage may be designed in various ways, such as for each assembly line, for each electrode line, or for each assembly electrode, and the present disclosure is not limited to a specific method.

As such, by applying the ground voltage to the electrodes forming specific assembly lines, leakage of the electric field is prevented, and it is possible to prevent color mixing from occurring due to the misassembly of the semiconductor light emitting diodes 1050 emitting light of different colors on the same line.

As described above, according to the embodiments of the present disclosure, there is an effect that the direction of electric field may be changed after the semiconductor light emitting diode 1050 is assembled, so that the semiconductor light emitting diode 1050 is fixed inside the cell 1070 more firmly, and the self-assembly yield may be improved by minimizing the semiconductor light emitting diode 1050 separated from the cell after the assembly.

In addition, since the direction of the electric field is changed after the semiconductor light emitting diode 1050 is assembled, it is possible to prevent leakage of the electric field to the outside of the cell 1070. Therefore, there is an effect that can prevent the misassembly of the semiconductor light emitting diode 1050.

The present disclosure is not limited to the configuration and method of the embodiments described above, and all or part of the embodiments may be selectively combined so that various modifications can be made thereto.

The invention claimed is:

1. A method for manufacturing a display device, in which semiconductor light emitting diodes put into a chamber containing a fluid are seated at preset positions on a substrate including a first electrode and a second electrode spaced apart from each other with a dielectric layer disposed therebetween by using an electric field and a magnetic field, the method comprising:
    applying a voltage to one of the first electrode and the second electrode to seat the semiconductor light emitting diodes at the preset positions on the substrate, respectively; and
    after seating the semiconductor light emitting diodes at the preset positions, applying a voltage to the first electrode and the second electrode so that the semiconductor light emitting diodes seated at the preset positions are fixed to the preset positions, respectively.

2. The method of claim 1, wherein the second electrode includes a plurality of lines extending in a first direction and arranged at predetermined intervals.

3. The method of claim 2, wherein, when semiconductor light emitting diodes emitting light of two or more different colors are assembled on the substrate, a ground voltage is applied to at least some of the plurality of lines of the second electrode according to emission colors of the semiconductor light emitting diodes put into the chamber.

4. The method of claim 1, wherein the display device includes:
- a base portion of the substrate;
- the first electrode formed on the base portion;
- the dielectric layer stacked on one surface of the first electrode;
- the second electrode disposed on the dielectric layer at a predetermined interval;
- a barrier rib portion stacked on the dielectric layer to cover the second electrode while forming a plurality of cells at the preset positions; and
- the semiconductor light emitting diodes seated in the plurality of cells.

\* \* \* \* \*